US007244683B2

(12) United States Patent
Chung et al.

(10) Patent No.: US 7,244,683 B2
(45) Date of Patent: Jul. 17, 2007

(54) INTEGRATION OF ALD/CVD BARRIERS WITH POROUS LOW K MATERIALS

(75) Inventors: Hua Chung, San Jose, CA (US); Nikolaos Bekiaris, San Jose, CA (US); Christophe Marcadal, Sunnyvale, CA (US); Ling Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 172 days.

(21) Appl. No.: 10/741,422

(22) Filed: Dec. 19, 2003

(65) Prior Publication Data

US 2004/0256351 A1 Dec. 23, 2004

Related U.S. Application Data

(60) Provisional application No. 60/438,480, filed on Jan. 7, 2003.

(51) Int. Cl.
*H01L 21/469* (2006.01)
*H01L 21/31* (2006.01)

(52) U.S. Cl. ...................... 438/758; 438/785
(58) Field of Classification Search ........... 134/1.1–1.3
See application file for complete search history.

(56) References Cited

U.S. PATENT DOCUMENTS

| 3,594,216 | A | 7/1971 | Charles et al. |
| 4,337,279 | A | 6/1982 | Polak |
| 4,413,022 | A | 11/1983 | Suntola et al. |
| 4,486,487 | A | 12/1984 | Skarp |
| 4,568,562 | A | 2/1986 | Phillips |
| 4,735,820 | A | 4/1988 | Agostino et al. |
| 4,803,094 | A | 2/1989 | Myers |
| 5,017,439 | A | 5/1991 | Brar et al. |
| 5,043,299 | A | 8/1991 | Chang et al. |
| 5,047,115 | A | 9/1991 | Charlet et al. |
| 5,186,718 | A | 2/1993 | Tepman et al. |
| 5,202,008 | A | 4/1993 | Talieh et al. |
| 5,203,957 | A | 4/1993 | Yoo et al. |
| 5,306,666 | A | 4/1994 | Izumi |
| 5,352,636 | A | 10/1994 | Beinglass |
| 5,374,570 | A | 12/1994 | Nasu et al. |

(Continued)

FOREIGN PATENT DOCUMENTS

EP 0 849 779 A2 6/1998

(Continued)

OTHER PUBLICATIONS

Wolf et al., Silcion Processing for the VLSI Era, vol. 1, 1986, p. 407-408.*

(Continued)

*Primary Examiner*—Duy-Vu N. Deo
(74) *Attorney, Agent, or Firm*—Patterson & Sheridan, LLP

(57) ABSTRACT

A method for processing substrates is provided. The method includes depositing and etching a low k dielectric layer on a substrate, pre-cleaning the substrate with a plasma, and depositing a barrier layer on the substrate. Pre-cleaning the substrate minimizes the diffusion of the barrier layer into the low k dielectric layer and/or enhances the deposition of the barrier layer.

22 Claims, 9 Drawing Sheets

U.S. PATENT DOCUMENTS

| | | | |
|---|---|---|---|
| 5,464,666 A | 11/1995 | Fine et al. | |
| 5,526,244 A | 6/1996 | Bishop | |
| 5,660,682 A | 8/1997 | Zhao et al. | |
| 5,711,811 A | 1/1998 | Suntola et al. | |
| 5,904,154 A | 5/1999 | Chien et al. | |
| 5,906,866 A | 5/1999 | Webb | |
| 5,923,056 A | 1/2000 | Wallace et al. | |
| 6,015,590 A | 1/2000 | Suntola et al. | |
| 6,015,917 A | 1/2000 | Bhandari et al. | |
| 6,084,302 A | 7/2000 | Sandhu | |
| 6,107,192 A | 8/2000 | Subrahmanyan et al. | |
| 6,113,771 A | 9/2000 | Landau et al. | |
| 6,124,158 A | 9/2000 | Dautartas et al. | |
| 6,139,700 A | 10/2000 | Kang et al. | |
| 6,144,060 A | 11/2000 | Park et al. | |
| 6,174,809 B1 | 1/2001 | Kang et al. | |
| 6,177,347 B1 | 1/2001 | Liu et al. | |
| 6,197,683 B1 | 3/2001 | Kang et al. | |
| 6,200,893 B1 | 3/2001 | Sneh | |
| 6,203,613 B1 | 3/2001 | Gates et al. | |
| 6,207,302 B1 | 3/2001 | Sugiura et al. | |
| 6,207,487 B1 | 3/2001 | Kim et al. | |
| 6,270,572 B1 | 8/2001 | Kim et al. | |
| 6,284,646 B1 | 9/2001 | Leem | |
| 6,287,965 B1 | 9/2001 | Kang et al. | |
| 6,305,314 B1 | 10/2001 | Sneh et al. | |
| 6,342,277 B1 | 1/2002 | Sherman | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,379,748 B1 | 4/2002 | Bhandari et al. | |
| 6,391,785 B1 | 5/2002 | Satta et al. | |
| 6,399,491 B2 | 6/2002 | Jeon et al. | |
| 6,416,577 B1 | 7/2002 | Suntoloa et al. | |
| 6,416,822 B1 | 7/2002 | Chiang et al. | |
| 6,428,859 B1 | 8/2002 | Chiang et al. | |
| 6,451,119 B2 | 9/2002 | Sneh et al. | |
| 6,451,695 B2 | 9/2002 | Sneh | |
| 6,458,701 B1 | 10/2002 | Chae et al. | |
| 6,464,779 B1 | 10/2002 | Powell et al. | |
| 6,468,924 B2 | 10/2002 | Lee et al. | |
| 6,475,276 B1 | 11/2002 | Elers et al. | |
| 6,475,910 B1 | 11/2002 | Sneh | |
| 6,478,872 B1 | 11/2002 | Chae et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,495,447 B1 | 12/2002 | Okada et al. | |
| 6,511,539 B1 | 1/2003 | Raaijmakers | |
| 6,528,432 B1 | 3/2003 | Ngo et al. | |
| 6,534,395 B2 | 3/2003 | Werkhoven et al. | |
| 6,541,374 B1* | 4/2003 | de Felipe et al. | 438/648 |
| 6,548,424 B2 | 4/2003 | Putkonen | |
| 6,551,929 B1 | 4/2003 | Kori et al. | |
| 6,569,501 B2 | 5/2003 | Chiang et al. | |
| 6,585,823 B1 | 7/2003 | Van Wijck | |
| 6,596,602 B2 | 7/2003 | Iizuka et al. | |
| 6,599,572 B2 | 7/2003 | Saanila et al. | |
| 6,607,976 B2 | 8/2003 | Chen et al. | |
| 6,620,723 B1 | 9/2003 | Byun et al. | |
| 6,620,956 B2 | 9/2003 | Chen et al. | |
| 6,630,201 B2 | 10/2003 | Chiang et al. | |
| 6,632,279 B1 | 10/2003 | Ritala et al. | |
| 6,686,271 B2 | 2/2004 | Raaijmakers et al. | |
| 6,753,258 B1* | 6/2004 | Gaillard et al. | 438/691 |
| 6,846,756 B2 | 1/2005 | Pan et al. | |
| 6,916,398 B2* | 7/2005 | Chen et al. | 156/345.33 |
| 2001/0000866 A1 | 5/2001 | Sneh et al. | |
| 2001/0002280 A1 | 5/2001 | Sneh | |
| 2001/0009140 A1 | 7/2001 | Bondestam et al. | |
| 2001/0009695 A1 | 7/2001 | Saanila et al. | |
| 2001/0024387 A1 | 9/2001 | Raaijmakers et al. | |
| 2001/0025979 A1 | 10/2001 | Kim et al. | |
| 2001/0028924 A1 | 10/2001 | Sherman | |
| 2001/0034123 A1 | 10/2001 | Jeon et al. | |
| 2001/0041250 A1 | 11/2001 | Werkhoven et al. | |
| 2001/0050039 A1 | 12/2001 | Park | |
| 2001/0054730 A1 | 12/2001 | Kim et al. | |
| 2001/0054769 A1 | 12/2001 | Raaijmakers et al. | |
| 2002/0000598 A1 | 1/2002 | Kang et al. | |
| 2002/0007790 A1 | 1/2002 | Park et al. | |
| 2002/0020869 A1 | 2/2002 | Park et al. | |
| 2002/0021544 A1 | 2/2002 | Cho et al. | |
| 2002/0031618 A1 | 3/2002 | Sherman | |
| 2002/0041931 A1 | 4/2002 | Suntola et al. | |
| 2002/0048635 A1 | 4/2002 | Kim et al. | |
| 2002/0052097 A1 | 5/2002 | Park | |
| 2002/0060363 A1* | 5/2002 | Xi et al. | 257/751 |
| 2002/0068458 A1 | 6/2002 | Chiang et al. | |
| 2002/0073924 A1 | 6/2002 | Chiang et al. | |
| 2002/0074588 A1 | 6/2002 | Lee | |
| 2002/0076481 A1 | 6/2002 | Chiang et al. | |
| 2002/0076507 A1 | 6/2002 | Chiang et al. | |
| 2002/0076508 A1 | 6/2002 | Chiang et al. | |
| 2002/0076837 A1 | 6/2002 | Hujanen et al. | |
| 2002/0081844 A1 | 6/2002 | Jeon et al. | |
| 2002/0086111 A1 | 7/2002 | Byun et al. | |
| 2002/0092584 A1 | 7/2002 | Soininen et al. | |
| 2002/0094689 A1 | 7/2002 | Park | |
| 2002/0098627 A1 | 7/2002 | Pomarede et al. | |
| 2002/0098685 A1 | 7/2002 | Sophie et al. | |
| 2002/0104481 A1 | 8/2002 | Chiang et al. | |
| 2002/0106536 A1 | 8/2002 | Lee et al. | |
| 2002/0106846 A1 | 8/2002 | Seutter et al. | |
| 2002/0117399 A1 | 8/2002 | Chen et al. | |
| 2002/0122884 A1 | 9/2002 | Chen et al. | |
| 2002/0127336 A1 | 9/2002 | Chen et al. | |
| 2002/0127745 A1 | 9/2002 | Lu et al. | |
| 2002/0135071 A1 | 9/2002 | Kang et al. | |
| 2002/0144655 A1 | 10/2002 | Chiang et al. | |
| 2002/0144657 A1 | 10/2002 | Chiang et al. | |
| 2002/0146511 A1 | 10/2002 | Chiang et al. | |
| 2002/0155722 A1 | 10/2002 | Satta et al. | |
| 2002/0162506 A1 | 11/2002 | Sneh et al. | |
| 2002/0164421 A1 | 11/2002 | Chiang et al. | |
| 2002/0164423 A1 | 11/2002 | Chiang et al. | |
| 2002/0177282 A1 | 11/2002 | Song | |
| 2002/0182320 A1 | 12/2002 | Leskela et al. | |
| 2002/0187256 A1 | 12/2002 | Elers et al. | |
| 2002/0187631 A1 | 12/2002 | Kim et al. | |
| 2002/0197402 A1 | 12/2002 | Chiang et al. | |
| 2002/0197863 A1 | 12/2002 | Mak et al. | |
| 2003/0013300 A1 | 1/2003 | Byun | |
| 2003/0013320 A1 | 1/2003 | Kim et al. | |
| 2003/0031807 A1 | 2/2003 | Elers et al. | |
| 2003/0032281 A1 | 2/2003 | Werkhoven et al. | |
| 2003/0042630 A1 | 3/2003 | Babcoke et al. | |
| 2003/0049931 A1 | 3/2003 | Disney | |
| 2003/0049942 A1 | 3/2003 | Byun et al. | |
| 2003/0053799 A1 | 3/2003 | Lei | |
| 2003/0054631 A1 | 3/2003 | Raaijmakers et al. | |
| 2003/0057526 A1 | 3/2003 | Chung et al. | |
| 2003/0057527 A1 | 3/2003 | Chung et al. | |
| 2003/0059538 A1 | 3/2003 | Chung et al. | |
| 2003/0072884 A1 | 4/2003 | Zhan et al. | |
| 2003/0072975 A1 | 4/2003 | Shero et al. | |
| 2003/0079686 A1 | 5/2003 | Chen et al. | |
| 2003/0082296 A1 | 5/2003 | Elers et al. | |
| 2003/0082300 A1 | 5/2003 | Todd et al. | |
| 2003/0082301 A1 | 5/2003 | Chen et al. | |
| 2003/0082307 A1 | 5/2003 | Chung et al. | |
| 2003/0085408 A1* | 5/2003 | Yang et al. | 257/77 |
| 2003/0089308 A1 | 5/2003 | Raaijamakers et al. | |
| 2003/0096468 A1 | 5/2003 | Soininen et al. | |

| | | |
|---|---|---|
| 2003/0097013 A1 | 5/2003 | Chen et al. |
| 2003/0101927 A1 | 6/2003 | Raaijmakers et al. |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121608 A1 | 7/2003 | Chen et al. |
| 2003/0124262 A1 | 7/2003 | Chen et al. |
| 2003/0129308 A1 | 7/2003 | Chen et al. |
| 2003/0129826 A1 | 7/2003 | Werkhoven et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0205729 A1 | 11/2003 | Basceri et al. |
| 2003/0213987 A1 | 11/2003 | Basceri et al. |
| 2003/0224578 A1 | 12/2003 | Chung et al. |
| 2003/0224600 A1 | 12/2003 | Cao et al. |
| 2004/0009307 A1 | 1/2004 | Koh et al. |
| 2004/0011504 A1 | 1/2004 | Ku et al. |
| 2004/0013803 A1 | 1/2004 | Chung et al. |
| 2004/0014320 A1 | 1/2004 | Chen et al. |
| 2004/0015300 A1 | 1/2004 | Ganguli et al. |
| 2004/0016866 A1 | 1/2004 | Huang et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0033698 A1 | 2/2004 | Lee et al. |
| 2004/0043630 A1 | 3/2004 | Vaartstra et al. |
| 2004/0046197 A1 | 3/2004 | Basceri et al. |
| 2004/0087136 A1* | 5/2004 | Wu et al. .................. 438/629 |

FOREIGN PATENT DOCUMENTS

| | | |
|---|---|---|
| EP | 1 077 476 A2 | 2/2001 |
| EP | 1081751 | 3/2001 |
| EP | 1142894 | 10/2001 |
| EP | 1167569 | 1/2002 |
| GB | 2 328 692 A | 3/1999 |
| GB | 2355727 | 10/2000 |
| JP | 56155526 | 1/1981 |
| JP | 02-246161 | 9/1990 |
| JP | 07-300649 | 11/1995 |
| JP | 2000-031387 | 1/2000 |
| JP | 2000-058777 | 2/2000 |
| JP | 10-308283 | 3/2001 |
| JP | 2001085331 | 3/2001 |
| JP | 2001-220294 | 8/2001 |
| JP | 2001-254181 | 9/2001 |
| JP | 2001-111000 | 12/2002 |
| JP | 2001-172767 | 10/2003 |
| WO | WO 96/17107 | 6/1996 |
| WO | WO 99/01595 | 1/1999 |
| WO | WO 99/29924 | 6/1999 |
| WO | WO 99/34424 A1 | 7/1999 |
| WO | WO 99/65064 | 12/1999 |
| WO | WO 00/15865 | 3/2000 |
| WO | WO 00/16377 | 3/2000 |
| WO | WO 00/34997 A1 | 6/2000 |
| WO | WO 00/54320 | 9/2000 |
| WO | WO 00/63957 | 10/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/66832 | 9/2001 |
| WO | WO 01/88972 | 11/2001 |
| WO | WO 02/01628 | 1/2002 |
| WO | WO 02/08485 | 1/2002 |
| WO | WO 02/43115 | 5/2002 |
| WO | WO 02/45167 | 6/2002 |
| WO | WO 02/45871 | 6/2002 |
| WO | WO 02/067319 | 8/2002 |
| WO | WO 03/044242 | 5/2003 |

OTHER PUBLICATIONS

Yasuchi Sawada, et al. "The Reduction of Copper Oxide Thin Films with hydrogen Plasma Generated by an Atomospheric-Pressure Glow Discharge", J. Phys. D: Appl. Phys. 29 (1996) pp. 2539-2544.

A. Grill, et al. "Low Dielectric Constant Films Prepared by Plasma-Enhanced Chemical Vapor Deposition from Tetramethylsilane", Journal of Applied Physics, vol. 85, No. 6, Mar. 15, 1999 pp. 3314-3318.

European Search Report for application No. 00307537.1, dated Jan. 29, 2003.

Partial European Search Report for application No. 00307537.1, dated Dec. 12, 2001.

Australian Search Report for application No. 200005008-8, dated Jun. 20, 2002.

U.S. Appl. No. 09/451,628, filed on Nov. 30, 1999.

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

George, et al. "Surface Chemistry for Atomic Layer Growth," J. Phys. Chem. 1996, 100, 13121-13131.

Hwang, et al. "Nanometer-Size α-$PbO_2$-type $TiO_2$ in Garnet: A Thermobarometer for Ultrahigh-Pressure Metamorphism," Science Vo. 288 (Apr. 14, 2000).

Juppo, et al. "Deposition of Copper Films by an Alternate Supply of CuCl and Zn," Journal of Vacuum Science & Technology, vol. 15, No. 4 (Jul. 1997), pp. 2330-2333.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) 435-448.

Kukli, et al. "Atomic Layer Epitaxy Growth of Tantalum Oxide Thin Films From $Ta(OC_2H_5)_5$ and $H_2O$," Journal of the Electrochemical Society, vol. 142, No. 5, May 1995; p. 1670-5.

Kukli, et al., "In Situ Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al., "Properties of $\{Nb_{1-x}Ta_x\}_2O_5$ Solid Solutions and $(Nb_{1-x}Ta_x)_2O_5$-$ZrO_2$ Nanolaminates Grown by Atomic Layer Epitaxy," 1997; p. 785-93.

Kukli, et al., "Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al., "Tailoring the Dielectric Properties of $HfO_2$-$Ta_2$-$O_5$ Nanolaminates," Applied Physics Letters, vol. 68, No. 26, Jun. 24, 1996; p. 3737-9.

Martensson, et al. "Atomic Layer Epitaxy of Copper Growth and Selectivity in the Cu(II)-2,2,6,6-tetramethyl-3-5heptanedionate $H_2$ Process," J. Electrochem. Soc., vol. 145, No. 8 (Aug. 1998), pp. 2926-2931.

Martensson, et al. "Atomic Layer Eptiaxy of Copper and Tantalum," Chem. Vap. Deposition (1997) vol. 3, No. 1.

Martensson, et al. "$Cu_2$ as Copper Source in Atomic Layer Epitaxy," Chemical Vapor Deposition. Proceedings of the Fourteenth International Conference and EUROCVD-11 (1997), pp. 1529-1536.

Martensson, et al. "Use of Atomic Layer Epitaxy for Fabrication of Si/TiN/Cu Structures," Journal of Vacuum Science & Technology, vol. 17, No. 5 (Sep. 1999), pp. 2122-2128.

McGeachin, "Synthesis and Properties of Some β-diketimines Derived from Acetylacetone, and Their Metal Complexes," Canadian Journal of Chemistry, vol. 46, (Jun. 1968) No. 11.

Min, et al. "Atomic Layer Deposition of TiN Thin Films by Sequential Introduction of Ti Precursor and NH3," Mat. Res. Soc. Symp. Proc. vol. 514 (1998).

Min, et al. "Chemical Vapor Deposition of Ti-Si-N Films With Alternating Source Supply," Mat. Rec. Soc. Symp. Proc. vol. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23-29.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From TiI$_4$ and NH$_3$," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., vol. 142, No. 8, Aug. 1995.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and Al$_2$O$_3$ Films Deposited by Atomic Layer Deposition," Chem. Vap. Deposition 1999, 5, No. 1.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vac. Sci. Technol. B., vol. 18, No. 4 (Jul. 2000); p. 2016-20.

Solanki, et al. "Atomic Layer Deposition of Copper Seed Layers," Electrochem. Solid-State Lett., vol. 3, No. 10 (2000), pp. 479-480.

Utriainen, et al. "Studies of Metallic Thin Film Growth in an Atomic Layer Epitaxy Reactor Using M(acac)$_2$(M=Ni,Cu, Pt) Precursors," Applied Surface Science, vol. 157, No. 3 (2000), pp. 151-158.

* cited by examiner

… (1)

INTEGRATION OF ALD/CVD BARRIERS WITH POROUS LOW K MATERIALS

CROSS-REFERENCE TO RELATED APPLICATIONS

This application claims benefit of U.S. provisional patent application Ser. No. 60/438,480, filed Jan. 7, 2003, which is herein incorporated by reference.

BACKGROUND OF THE INVENTION

1. Field of the Invention

Embodiments of the present invention relate to a method for manufacturing integrated circuit devices. More particularly, embodiments of the invention relate to forming metal interconnect structures having a barrier layer contacting at least a part of a dielectric layer.

2. Description of the Related Art

As the structure size of integrated circuit (IC) devices is scaled down to sub-quarter micron dimensions, electrical resistance and current densities have become an area for concern and improvement. Multilevel interconnect technology is used to form high aspect ratio features, including contacts, plugs, vias, lines, wires, and other features. A typical process for forming an interconnect on a substrate includes depositing one or more layers, etching at least one of the layer(s) to form one or more features, depositing a barrier layer in the feature(s) and depositing one or more layers to fill the feature. Typically, a feature is formed within a dielectric material disposed between a lower conductive layer and an upper conductive layer. The interconnect is formed within the feature to link the upper and lower conductive layers. Reliable formation of these interconnect features is important to the production of the circuits and is instrumental in the continued effort to increase circuit density and quality.

Copper has recently become a choice metal for filling sub-micron, high aspect ratio interconnect features because copper and its alloys have lower resistivities than aluminum. However, copper diffuses more readily into surrounding materials and can alter the electronic device characteristics of the adjacent layers. For example, such diffusion can form a conductive path between layers, thereby reducing the reliability of the overall circuit and possibly cause device failure.

Barrier layers are deposited prior to copper metallization to prevent or impede the diffusion of copper atoms. Barrier layers typically contain a refractory metal such as tungsten, titanium, tantalum, and nitrides thereof, which all have a greater resistivity than copper. To deposit a barrier layer within a feature, the barrier layer must be deposited on the bottom and sidewalls of the feature. The addition of the barrier layer on the bottom of the feature not only increases the overall resistance of the feature, but also forms an obstruction between higher and lower metal interconnects of a multi-layered interconnect structure.

The barrier layers are often deposited on dielectric layers that have been etched to include one or more features. The dielectric layers are typically formed of low k (dielectric constant $k \leq 4.0$) material. The low k layers may be porous layers. During the deposition of a barrier layer over a porous low k layer, the precursors used to form the barrier layer can diffuse into the pores of the porous low k layer. As with the diffusion of copper discussed earlier, the diffusion of barrier materials is problematic. The diffusion of barrier layer precursors into the porous low k layer can raise the dielectric constant of the low k layer, resulting in, for example, current leakage in a device.

The deposition of barrier layers can also be a time-consuming step, as the initial deposition or nucleation of barrier layers can be slow.

There is a need, therefore, for a processing sequence in which a barrier layer is deposited on a dielectric layer such that the diffusion of barrier layer precursors into the dielectric layer is minimized. There is also a need for a process sequence in which a barrier layer is deposited on a dielectric layer at a faster rate.

SUMMARY OF THE INVENTION

A method for processing substrates is provided. In one aspect, a method for processing a substrate includes depositing a low k dielectric layer on a substrate. The low k dielectric layer is then etched, so that a hole is formed in the dielectric layer. Once etched, the substrate is degassed, then pre-cleaned. The pre-cleaning step includes exposing the substrate to one or more plasmas from one or more gases selected from the group of argon, helium, hydrogen, nitrogen, fluorine-containing compounds, oxidizing gases, and combinations thereof. After pre-cleaning, a barrier layer is deposited on the substrate, and then a seed layer is deposited on the substrate. Finally, a metal layer is deposited on the seed layer to fill the hole in the dielectric layer.

In another aspect, a method for processing a substrate includes depositing an etch stop on a substrate. A low k dielectric layer is then deposited on the etch stop. The low k dielectric layer is then etched, so that a hole is formed in the dielectric layer. Once etched, the substrate is degassed, then pre-cleaned. The pre-cleaning step includes exposing the substrate to one or more plasmas of one or more gases selected from the group of argon, helium, hydrogen, nitrogen, fluorine-containing compounds, oxidizing gases, and combinations thereof. After pre-cleaning, the etch stop is etched, and then a barrier layer is deposited on the substrate. A seed layer is then deposited on the substrate. Finally, a metal layer is electroplated on the seed layer to fill the hole in the dielectric layer.

BRIEF DESCRIPTION OF THE DRAWINGS

So that the manner in which the above recited features of the present invention can be understood in detail, a more particular description of the invention, briefly summarized above, may be had by reference to the embodiments that are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

A process sequence for forming one or more interconnect structures is provided. Interconnect structures formed according to embodiments described herein have an overall lower resistivity and better electrical properties than interconnects of the prior art, and are particularly useful for making memory and logic structures in the fabrication of integrated circuits. The formation of the interconnect structures includes the formation of a thin barrier layer at least partially deposited on an underlying metal plug, a seed layer at least partially deposited on the barrier layer, and a bulk metal layer at least partially deposited on the seed layer. The term "interconnect" as used herein refers to any conductive path formed within an integrated circuit. The term "bulk" as used herein refers to a greater thickness of material deposited in relation to the thickness of other materials deposited to form the interconnect structure.

Embodiments of the invention provide a process integration method or sequence for the deposition of barrier layers. It is believed that the combination of the pre-cleaning process and the barrier layer deposition described herein contributes to the formation of barrier layers that do not infiltrate significantly into the dielectric layers upon which they are deposited. Embodiments of the invention also enhance the nucleation and deposition of barrier layers.

Figure 1:
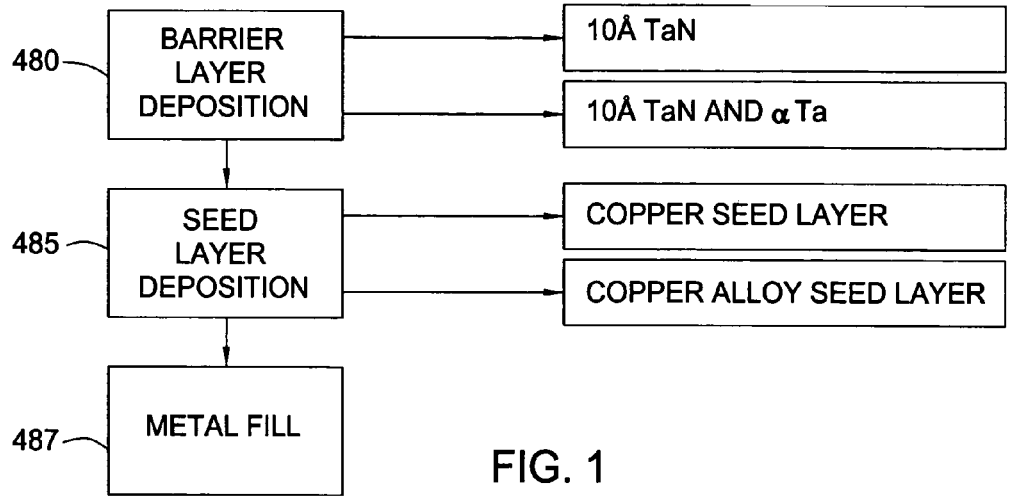
FIG. 1 illustrates processing sequences according to various embodiments of the invention described herein.

FIG. 1 illustrates the process sequence according to embodiments of the invention. A thin barrier layer first is deposited at least partially on an underlying substrate surface, such as a lower level metal interconnect or a metal gate, for example, as shown at step 480. The barrier layer is deposited according to a cyclical layer deposition technique to provide excellent barrier properties yet permit a subsequently deposited metal layer to communicate with a metal plug without having to etch the barrier layer. In one aspect, the barrier layer is a refractory metal-containing layer, such as tantalum, titanium, and tungsten, for example, and may include a refractory metal nitride material, such as tantalum nitride (TaN). In another aspect, the barrier layer is a thin bi-layer of TaN and alpha-phase tantalum. In yet another aspect, the barrier layer may be a ternary material formed from a refractory metal containing compound, a silicon-containing compound and a nitrogen-containing compound. The barrier layer may also act as a wetting layer, adhesion layer, or glue layer for subsequent metallization.

A "thin layer" as used herein refers to a layer of material deposited on a substrate surface having a thickness of about 20 angstroms (Å) or less, such as about 10 Å. The thickness of the barrier layer is so small/thin that electrons of the adjacent metal interconnects can tunnel through the barrier layer. Accordingly, the barrier layer significantly enhances metal interconnect electrical performance by lowering overall electrical resistance and providing good device reliability without having to perform an etch or other type of removal of the barrier layer.

The thin barrier layer deposited according to the cyclical deposition methods described herein shows evidence of an epitaxial growth phenomenon. In other words, the barrier layer takes on the same or substantially the same crystallographic characteristics as the underlying layer despite its amorphous character. As a result, a substantially single crystal is grown such that there is no void formation at an interface between the barrier layer and the underlying layer. Likewise, subsequent metal layers deposited over the barrier layer exhibit the same or substantially the same epitaxial growth characteristics that continue the formation of the single crystal. Accordingly, no void formation is produced at this interface. The resulting structure resembling a single crystal thus eliminates void formation, thereby substantially increasing device reliability. The single crystal structure also reduces the overall resistance of the interconnect feature while still providing excellent barrier properties. Furthermore, it is believed that the conformal and uniform crystalline orientation across the interconnect material interfaces reduces the susceptibility of electromigration and stress migration.

"Cyclical deposition" as used herein refers to the sequential introduction of two or more compounds to deposit a thin layer on a substrate surface. The two or more compounds are introduced sequentially into a reaction zone of a processing chamber. Each compound introduction is separated by a time delay/pause allowing each compound to adhere and/or react on the substrate surface. In one aspect, a first compound A is dosed/pulsed into the reaction zone followed by a first time delay/pause. Next, a second compound B is dosed/pulsed into the reaction zone followed by a second time delay. When formation of a ternary material is desired, such as, for example, titanium silicon nitride, a third compound C, is dosed/pulsed into the reaction zone followed by a third time delay. These sequential tandem steps comprising a pulse of reactive compound followed by a time delay may be repeated until a desired film or film thickness is formed on the substrate surface.

A "pulse/dose" as used herein is intended to refer to a quantity of a particular compound that is intermittently or non-continuously introduced into a reaction zone of a processing chamber. The quantity of a particular compound within each pulse may vary, depending on the flow rate of the compound and/or the duration of the pulse.

A "compound" is intended to include one or more precursors, reductants, reactants, and/or catalysts. Each compound may be a single compound or a mixture/combination of two or more compounds.

Still referring to FIG. 1, a seed layer is at least partially deposited on the barrier layer, as shown at step 485. The seed layer may be deposited using any conventional deposition technique, such as chemical vapor deposition (CVD), physical vapor deposition (PVD), electroplating, or electroless plating. Preferably, the seed layer is deposited conformally on the underlying barrier layer to have a thickness between about 100 Å and about 500 Å. In one aspect, the seed layer is a conventional copper seed layer. In another aspect, the seed layer is a dual alloy seed layer. Exemplary dual alloy seed layers include: 1) undoped copper deposited utilizing a target containing undoped copper, 2) a copper alloy containing aluminum in a concentration of about 2.0 atomic percent deposited utilizing a copper-aluminum target comprising aluminum in a concentration of about 2.0 atomic percent, 3) a copper alloy containing tin in a concentration of about 2.0 atomic percent deposited utilizing a copper-tin target comprising tin in a concentration of about 2.0 atomic percent, and 4) a copper alloy containing zirconium in a concentration of about 2.0 atomic percent deposited utilizing a copper-zirconium target comprising zirconium in a concentration of about 2.0 atomic percent.

A bulk metal layer is at least partially deposited on the seed layer, as shown at step 487. The metal layer also may be deposited using any conventional deposition technique, such as chemical vapor deposition (CVD), physical vapor deposition (PVD), electroplating, or electroless plating. The metal layer preferably includes any conductive material such as, for example, aluminum, copper, tungsten, or combinations thereof.

Figure 2A:
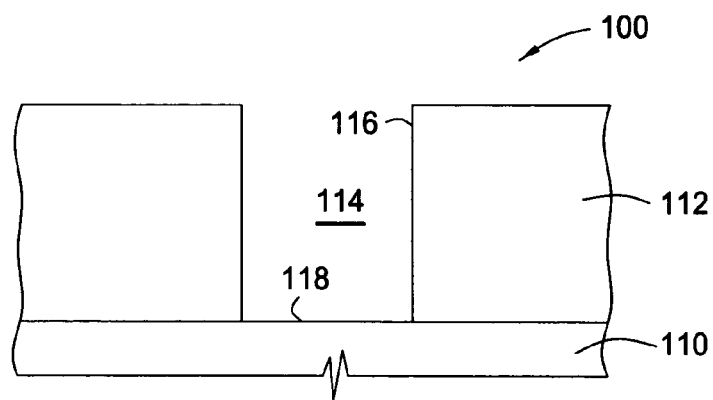
FIGS. 2A-2D are schematic cross section views of an exemplary structure at different stages of an interconnect fabrication sequence according to embodiments of the invention.

FIGS. 2A-2D are schematic representations of an exemplary interconnect structure at different stages of fabrication. FIG. 2A shows a substrate 100 having an underlying metal layer 110 having a dielectric layer 112 formed thereon. The underlying metal layer 110 may contain any conductive metal such as aluminum, copper, tungsten, or combinations thereof, for example, and may form part of an interconnect feature such as a plug, via, contact, line, wire, or be part of a metal gate electrode. The dielectric layer 112 may be any dielectric material including a low k dielectric material ($k \leq 4.0$), whether presently known or yet to be discovered. For example, the dielectric layer 112 may be a silicon oxide or a carbon doped silicon oxide, for example. FIG. 2 shows the dielectric layer 112 etched to form a feature 114. Such an etch may be performed using conventional techniques. The feature 114 may be a plug, via, contact, line, wire, or any other interconnect component. Typically, the feature 114 has vertical sidewalls 116 and a floor 118, having an aspect ratio of about 4:1 or greater, such as about 6:1. The floor 118 exposes at least a portion of the lower level metal interconnect 110.

Figure 2B:
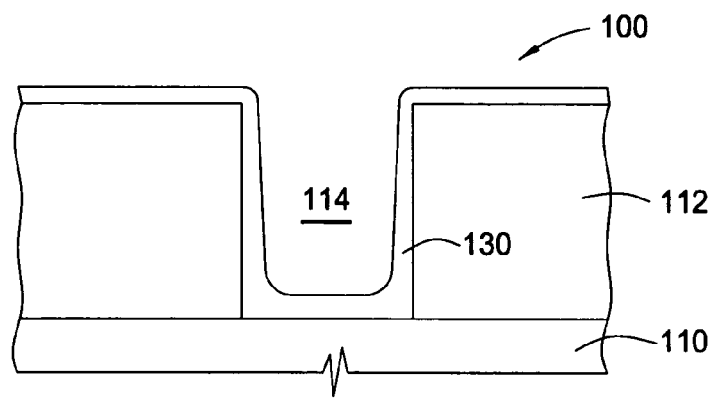

Referring to FIG. 2B, the barrier layer 130 is conformally deposited on the floor 118 as well as the side walls 116 of the feature 114. Preferably, the barrier layer contains tantalum nitride deposited to a thickness of about 20 Å or less, preferably about 10 Å, by providing one or more pulses of a tantalum-containing compound at a flow rate between about 100 sccm and about 1,000 sccm for a time period of about 1.0 second or less and one or more pulses of a nitrogen-containing compound at a flow rate between about 100 sccm and about 1,000 sccm for a time period of about 1.0 second or less to a reaction zone having a substrate disposed therein. Exemplary tantalum-containing compounds include t-butylimino tris(diethylamino) tantalum (TBTDET), pentakis (ethylmethylamino), tantalum (PEMAT), pentakis (dimethylamino) tantalum (PDMAT), pentakis (diethylamino) tantalum (PDEAT), t-butylimino tris (diethyl methylamino) tantalum(TBTMET), t-butylimino tris(dimethyl amino) tantalum (TBTDMT), bis(cyclopentadienyl) tantalum trihydride (($Cp)_2TaH_3$), bis(methylcyclopentadienyl) tantalum trihydride (($CpMe)_2TaH_3$), derivatives thereof, and combinations thereof. Exemplary nitrogen-containing compounds include ammonia, hydrazine, methylhydrazine, dimethylhydrazine, t-butylhydrazine, phenylhydrazine, azoisobutane, ethylazide, derivatives thereof, and combinations thereof.

It is to be understood that these compounds or any other compound not listed above may be a solid, liquid, or gas at room temperature. For example, PDMAT is a solid at room temperature and TBTDET is a liquid at room temperature. Accordingly, such non-gas phase precursors are subjected to a sublimation or vaporization step, both well known in the art, prior to introduction into the processing chamber. A carrier gas, such as argon, helium, nitrogen, hydrogen, or a mixture thereof, may also be used to help deliver the compound into the processing chamber, as is commonly known in the art.

Pulses of the reactive compounds are performed sequentially, accompanied by a separate flow of non-reactive gas at a rate between about 200 sccm and about 1,000 sccm. The flow of non-reactive gas may be pulsed between each pulse of the reactive compounds or the flow of non-reactive gas may be continuous throughout the deposition process. The flow of non-reactive gas, whether pulsed or continuous, serves to remove any excess reactants from the reaction zone. This is done to prevent unwanted gas phase reactions of the reactive compounds, and to remove reaction by-products from the processing chamber, in a function similar to a purge gas. In addition, the flow of non-reactive gas aids in delivery of the reactive compounds to the substrate surface, similar to the function of a carrier gas. The term "non-reactive gas" as used herein refers to a single gas or a mixture of gases that is not a reactant in the formation of the interconnect structure. Exemplary non-reactive gases include argon, helium, nitrogen, hydrogen, and combinations thereof.

"Reaction zone" is intended to include an area that is in fluid communication with a substrate surface being processed. The reaction zone may be an area or volume within a processing chamber that is between a gas source and the substrate surface. For example, the reaction zone includes any volume downstream of a dosing valve in which a substrate is disposed.

The durations for each pulse/dose are variable and may be adjusted to accommodate, for example, the volume capacity of the processing chamber as well as the capabilities of a vacuum system coupled thereto. Additionally, the dose time of a compound may vary according to the flow rate of the compound, the pressure of the compound and/or the process environment, the temperature of the compound and/or the process environment, the type of dosing valve, the type of control system employed, as well as the ability of the compound to adsorb onto the substrate surface. Dose times also may vary based upon the type of layer being formed and the geometry of the device being formed.

Typically, with processing conditions and equipment currently used in the art, the duration for each pulse/dose or "dose time" is about 1.0 second or less. However, dose time can range from microseconds to milliseconds to seconds, and even to minutes, depending on factors such as those described above. In general, a dose time should be long enough to provide a volume of compound sufficient to adsorb/chemisorb onto the surface of the substrate and form a layer.

Figure 3:
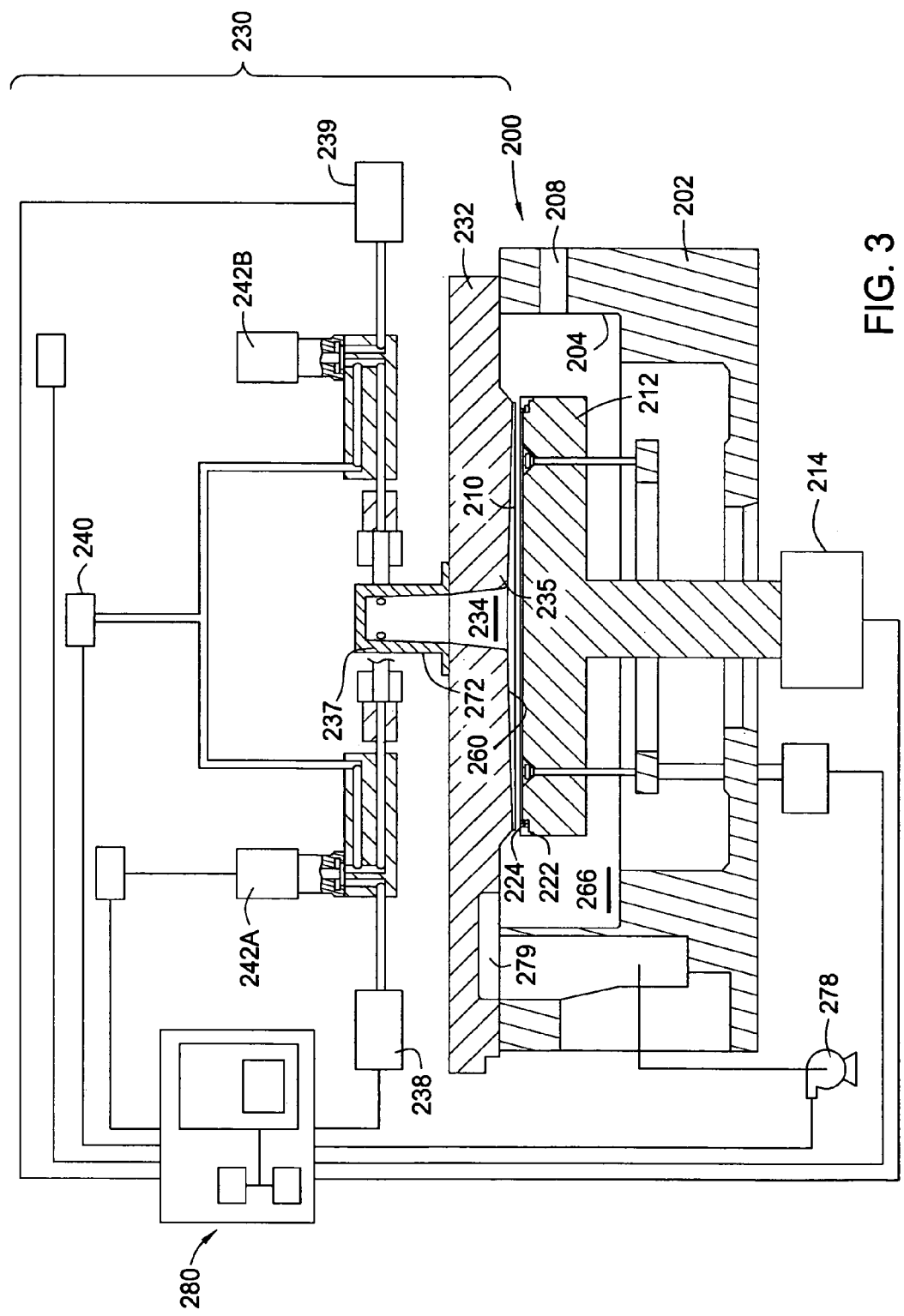
FIG. 3 illustrates a schematic, partial cross section of an exemplary processing chamber 200 for forming a thin barrier layer according to deposition techniques described herein.

FIG. 3 illustrates a schematic, partial cross section of an exemplary processing chamber 200 for forming a barrier layer according to embodiments of the present invention. Such a processing chamber 200 is available from Applied Materials, Inc. located in Santa Clara, Calif., and a brief description of chamber 200 follows. A more detailed description may be found in commonly assigned U.S. patent application Ser. No. 10/032,284, entitled "Gas Delivery Apparatus and Method For Atomic Layer Deposition", filed on Dec. 21, 2001, which is incorporated herein by reference.

The processing chamber 200 may be integrated into an integrated processing platform, such as an Endura® platform also available from Applied Materials, Inc. Details of the Endura® platform are described in commonly assigned U.S. patent application Ser. No. 09/451,628, entitled "Integrated Modular Processing Platform", filed on Nov. 30, 1999, which is incorporated by reference herein.

Referring to FIG. 3, the chamber 200 includes a chamber body 202 having a slit valve 208 formed in a sidewall 204 and a substrate support 212. The substrate support 212 is mounted to a lift motor 214 to raise and lower the substrate support 212 and a substrate 210 disposed thereon. The substrate support 212 may also include a vacuum chuck, an electrostatic chuck, or a clamp ring for securing the substrate 210 to the substrate support 212 during processing. Further, the substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 that provides a purge gas to prevent deposition on a peripheral portion of the substrate 210.

A gas delivery apparatus 230 is located at an upper portion of the chamber body 202 to provide a gas, such as a process gas and/or a purge gas, to the chamber 200. A vacuum system 278 is in communication with a pumping channel 279 to evacuate gases from the chamber 200 and to help maintain a desired pressure or a desired pressure range inside a pumping zone 266 of the chamber 200.

The gas delivery apparatus 230 includes a chamber lid 232 having an expanding channel 234 formed within a central portion thereof. The chamber lid 232 also includes a bottom surface 260 extending from the expanding channel 234 to a peripheral portion of the chamber lid 232. The bottom surface 260 is sized and shaped to substantially cover the substrate 210 disposed on the substrate support 212. The expanding channel 234 has an inner diameter that gradually increases from an upper portion 237 to an intermediate portion 272 to a lower portion 235 adjacent the bottom surface 260 of the chamber lid 232. The velocity of a gas flowing therethrough decreases as the gas flows through the expanding channel 234 due to the expansion of the gas. The decreased gas velocity reduces the likelihood of blowing off reactants adsorbed on the surface of the substrate 210.

The gas delivery apparatus 230 also includes at least two high speed actuating valves 242A and 242B having one or more ports. At least one valve 242A, 242B is dedicated to each reactive compound. For example, a first valve is dedicated to a refractory metal-containing compound, such as tantalum and titanium, and a second valve is dedicated to a nitrogen-containing compound. When a ternary material is desired, a third valve is dedicated to an additional compound. For example, if a silicide is desired, the additional compound may be a silicon-containing compound.

The valves 242A and 242B may be any valve capable of precisely and repeatedly delivering short pulses of compounds into the chamber body 202. In some cases, the on/off cycles or pulses of the valves 242A, 242B may be as fast as about 100 msec or less. The valves 242A, 242B can be directly controlled by a system computer, such as a mainframe for example, or controlled by a chamber/application specific controller, such as a programmable logic computer (PLC) which is described in more detail in the co-pending U.S. patent application Ser. No. 09/800,881, entitled "Valve Control System For ALD Chamber", filed on Mar. 7, 2001, which is incorporated by reference herein. For example, the valves 242A, 242B may be electronically controlled (EC) valves, which are commercially available from Fujikin of Japan as part number FR-21-6.35 UGF-APD.

To facilitate the control and automation of the overall system, the integrated processing system may include a controller 280 comprising a central processing unit (CPU), memory, and support circuits. The CPU may be one of any form of computer processors that are used in industrial settings for controlling various drives and pressures. The memory is connected to the CPU, and may be one or more of a readily available memory such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

In a particular embodiment, a TaN barrier layer is formed by cyclically introducing PDMAT and ammonia to the substrate surface. To initiate the cyclical deposition of the TaN layer, a carrier/inert gas such as argon is introduced, such as at a flow rate of about 50 sccm to about 250 sccm for about 0.1 seconds to about 2 seconds, into the processing chamber 200 to stabilize the pressure and temperature therein. The carrier gas is allowed to flow continuously during the deposition process such that only the argon flows between pulses of each compound. A first pulse of PDMAT is provided from the gas source 238 using an argon carrier flow at a flow rate between about 50 sccm and about 500 sccm, with a pulse time of about 0.1 seconds to about 5 seconds after the chamber temperature and pressure have been stabilized at about 200° C. to about 300° C. and about 1 Torr to about 5 Torr. A pulse of ammonia is then provided from the gas source 239 at a flow rate between about 250 sccm and about 2500 sccm, with a pulse time of about 0.1 seconds to about 10 seconds.

A pause between pulses of PDMAT and ammonia is about 0.1 seconds to about 5 seconds. In various aspects, a reduction in time between pulses provides higher processing throughput. In addition, argon gas flowing between about 1000 sccm and about 10 slm is provided continuously from the gas source 240 through each valve 242A, 242B. In one aspect, a pulse of PDMAT may still be in the chamber when a pulse of ammonia enters. In general, the duration of the carrier gas and/or pump evacuation should be long enough to prevent the pulses of PDMAT and ammonia from mixing together in the reaction zone.

The heater temperature is maintained between about 100° C. and about 300° C. at a chamber pressure between about 1.0 and about 5.0 Torr. Each cycle consisting of a pulse of PDMAT, a pause, a pulse of ammonia, and a second pause may form a tantalum nitride film having a thickness of between about 0.3 Å and about 1.0 Å per cycle. The alternating sequence may be repeated until the desired film thickness is achieved. Such a desired thickness in this case is less than about 20 Å, and typically is about 10 Å. Accordingly, the deposition method requires between 10 and 70 cycles, more typically between 20 and 30 cycles.

In another aspect, a ternary barrier layer having a thickness less than about 20 Å, such as 10 Å, is deposited by providing one or more pulses of a refractory metal-containing compound, one or more pulses of a nitrogen-containing compound, and one or more pulses of a silicon-containing compound. Each pulse is adjusted to provide a desirable composition, silicon incorporation level, thickness, density, and step coverage of the refractory metal silicon nitride layer. A "ternary barrier layer" as used herein refers to a material having a composition comprising three major elements, such as titanium, nitrogen and silicon. An exemplary "ternary barrier layer" may also include tantalum, nitrogen and silicon.

Each pulse is performed sequentially, and is accompanied by a separate flow of carrier/inert gas at the same process conditions described above. The flow of carrier/inert gas may be pulsed between each pulse of reactive compound or the flow of carrier/inert gas may be continuous throughout the deposition process.

Preferably, the ternary barrier layer is comprised of titanium silicon nitride. In such an embodiment, each cycle consists of a pulse of a titanium-containing compound, a first pause, a pulse of a silicon-containing compound, a second-pause, a pulse of a nitrogen-containing compound, and a third pause. Exemplary titanium-containing compound include tetrakis (dimethylamino) titanium (TDMAT), tetrakis (ethylmethylamino) titanium (TEMAT), tetrakis (di-ethylamino) titanium (TDEAT), titanium tetrachloride ($TiCl_4$), titanium iodide ($TiI_4$), titanium bromide ($TiBr_4$), and other titanium halides. Exemplary silicon-containing compounds include silane, disilane, methylsilane, dimethylsilane, chlorosilane ($SiH_3Cl$), dichlorosilane ($SiH_2Cl_2$), and trichlorosilane ($SiHCl_3$). Exemplary nitrogen-containing compounds include: ammonia, hydrazine, methylhydrazine, dimethylhydrazine, t-butylhydrazine, phenylhydrazine, azoisobutane, ethylazide, derivatives thereof, and combinations thereof.

To initiate the cyclical deposition of a $Ti_xSi_yN$ layer, argon is introduced into the processing chamber 200 to stabilize the pressure and temperature therein. The flow of argon is continuous during the deposition process and only the argon flows between the pulses of each reactant compound. The flow of argon is between about 100 sccm and about 1000 sccm, such as between about 100 sccm and about 400 sccm. In one embodiment, the chamber pressure and temperature are stabilized at about 250° C. and 2 Torr, and a pulse of TDMAT is provided at a flow rate between about between about 10 sccm and about 1000 sccm, with a pulse time of about 0.6 seconds or less. A pause after the pulse of TDMAT and before the pulse of silane is about 1.0 second or less, preferably about 0.5 seconds or less, more preferably about 0.1 seconds or less. A pulse of silane is then provided at a flow rate between about 5 sccm and about 500 sccm, with a pulse time of 1 second or less. A pause after the pulse of silane and before the pulse of ammonia is about 1.0 second or less, about 0.5 seconds or less, or about 0.1 seconds or less. A pulse of ammonia is then provided at a flow rate between about 100 sccm and about 5,000 sccm, with a pulse time of about 0.6 seconds or less. A pause after the pulse of ammonia is also about 1.0 second or less, about 0.5 seconds or less, or about 0.1 seconds or less. In one aspect, a pulse of TDMAT may still be in the chamber when a pulse of silane enters, and a pulse of silane may still be in the chamber when a pulse of ammonia enters.

The heater temperature is maintained between about 100° C. and about 300° C. at a chamber pressure between about 1.0 and about 5.0 Torr. Each cycle consisting of a pulse of TDMAT, pause, pulse of silane, pause, pulse of ammonia, and pause provides a titanium silicon nitride layer having a thickness between about 0.3 Å and about 1.0 Å per cycle. The alternating sequence may be repeated until the desired thickness is achieved. Typically, the desired thickness is less than about 20 Å, such as about 1.0 Å. Accordingly, the deposition method requires between 10 and 70 cycles.

In yet another aspect, an alpha phase tantalum ($\alpha$-Ta) layer having a thickness of about 20 Å or less, such as about 10 Å, may be deposited over at least a portion of the previously deposited binary (TaN) or ternary (TiSiN) layers. The $\alpha$-Ta layer may be deposited using conventional techniques, such as PVD and CVD for example, to form a bilayer stack. For example, the bilayer stack may include a TaN portion deposited by cyclical layer deposition described above and an $\alpha$-Ta portion deposited by high density plasma physical vapor deposition (HDP-PVD).

To further illustrate, the $\alpha$-Ta portion of the stack may be deposited using an ionized metal plasma (IMP) chamber, such as a Vectra™ chamber, available from Applied Materials, Inc. of Santa Clara, Calif. The IMP chamber includes a target, coil, and biased substrate support member, and may also be integrated into an Endura® platform, also available from Applied Materials, Inc. A power between about 0.5 kW and about 5 kW is applied to the target, and a power between about 0.5 kW and 3 kW is applied to the coil. A power between about 200 W and about 500 W at a frequency of about 13.56 MHz is also applied to the substrate support member to bias the substrate. Argon is flowed into the chamber at a rate of about 35 sccm to about 85 sccm, and nitrogen may be added to the chamber at a rate of about 5 sccm to about 100 sccm. The pressure of the chamber is typically between about 5 mTorr to about 100 mTorr, while the temperature of the chamber is between about 20° C. and about 300° C.

Referring again to FIG. 2, prior to depositing the barrier layer 130, the patterned or etched substrate dielectric layer 112 is pre-cleaned. For example, reactive gases are excited into a plasma within a remote plasma source chamber such as a Reactive Pre-clean chamber or a Pre-Clean II chamber available from Applied Materials, Inc., located in Santa Clara, Calif. Pre-cleaning may also be done within a metal CVD or PVD chamber by connecting the chamber to a remote plasma source. Alternatively, metal deposition chambers having gas delivery systems could be modified to deliver the pre-cleaning gas plasma through existing gas inlets such as a gas distribution showerhead positioned above the substrate.

In one aspect, the reactive pre-clean process forms radicals from one or more plasmas from one or more reactive gases such as argon, helium, hydrogen, nitrogen, fluorine-containing compounds, oxidizing gases, and combinations thereof. The oxidizing gases may be selected from the group of oxygen, ozone, nitrous oxide, nitric oxide, and $H_2O$ gas.

Figure 4:
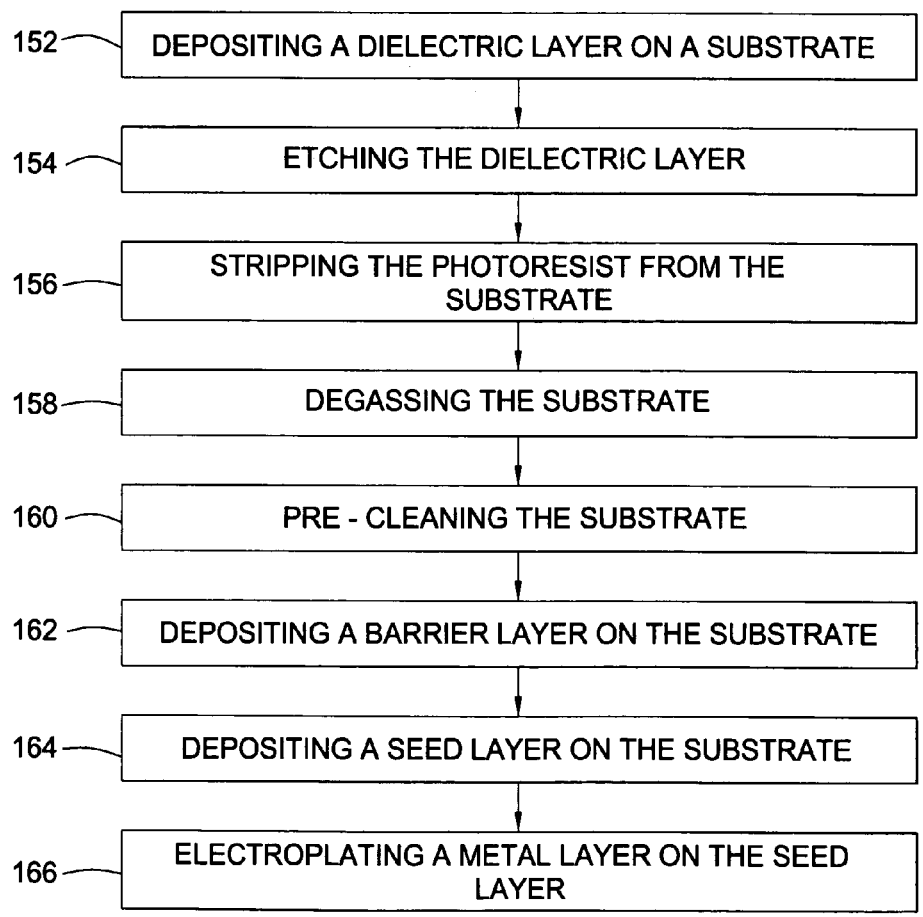
FIG. 4 illustrates a processing sequence according to various embodiments of the invention.

The etched substrate dielectric layer 112 may be pre-cleaned as part of an integrated substrate processing sequence. A brief example of a processing sequence is shown in FIG. 4. First, a dielectric layer is deposited on a substrate, as shown at step 152. The dielectric layer is then etched, to form a feature therein, as shown at step 154 using conventional photoresist patterning and etching techniques. The photoresist is then stripped from the substrate, as shown at step 156, and the substrate is degassed, as shown at step 158. Next, the substrate is pre-cleaned, as shown at step 160.

After pre-cleaning, a barrier layer is deposited on the substrate, as shown at step 162, a seed layer is deposited on the substrate, as shown at step 164, and a metal layer is electroplated on the seed layer, as shown at step 166.

Figure 5:
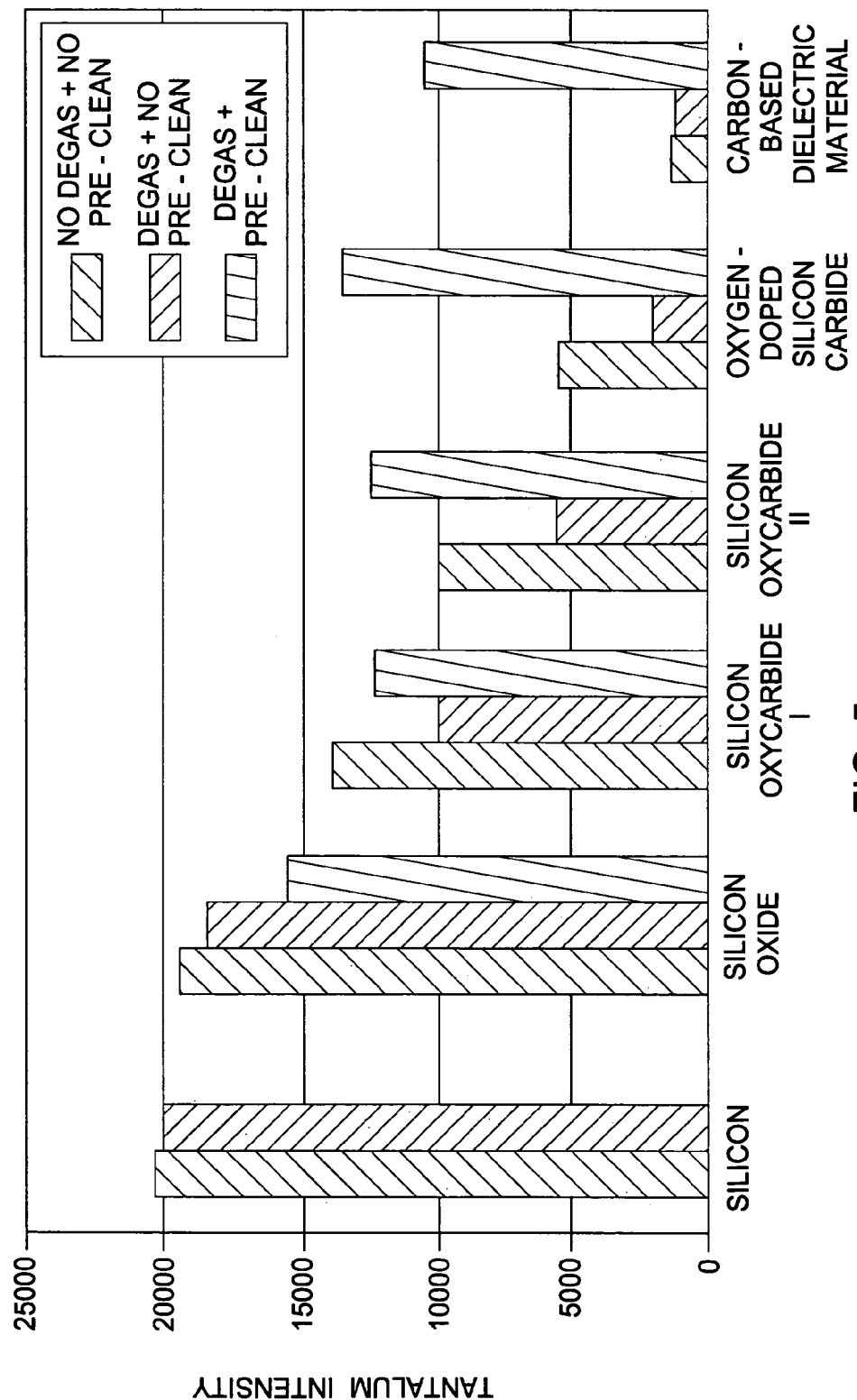
FIG. 5 is a graph showing the amount of tantalum deposited on different substrates in various embodiments of the invention described herein.
Figure 6:
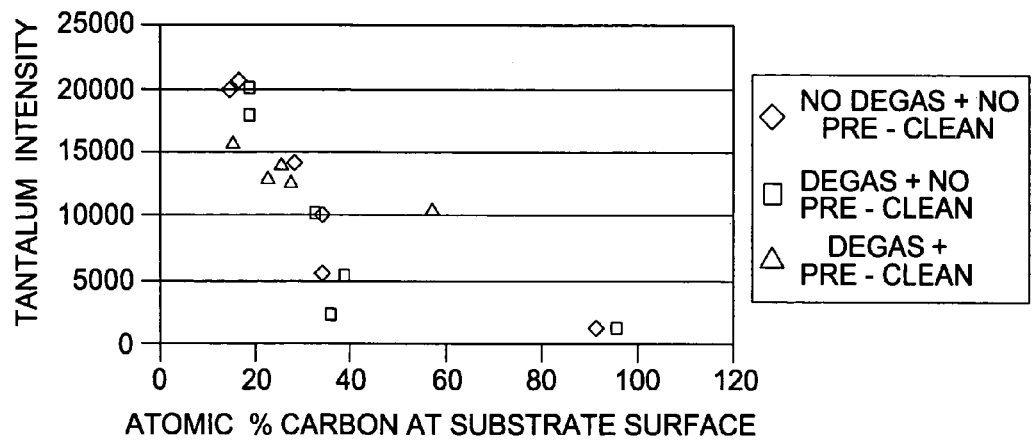
FIG. 6 is a graph showing the amount of tantalum deposited on different substrates having different atomic % carbon in various embodiments of the invention described herein.
Figure 7:
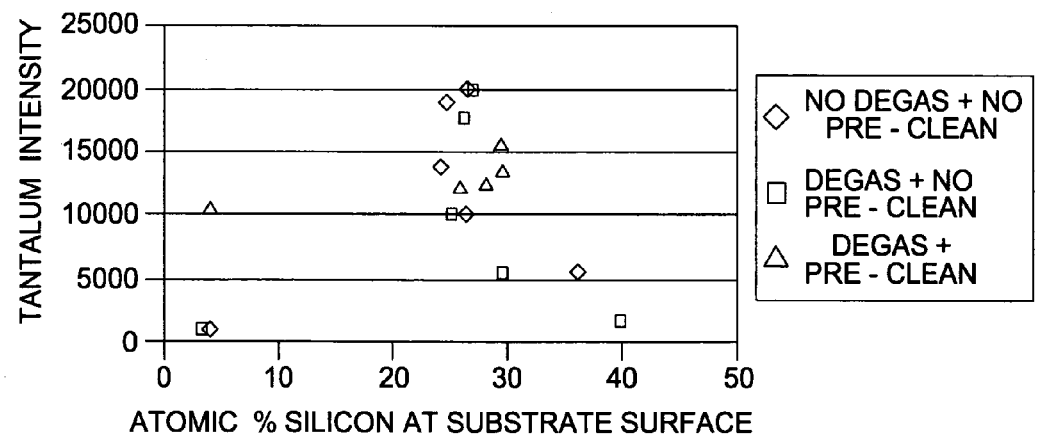
FIG. 7 is a graph showing the amount of tantalum deposited on different substrates having different atomic % silicon in various embodiments of the invention described herein.
Figure 8:
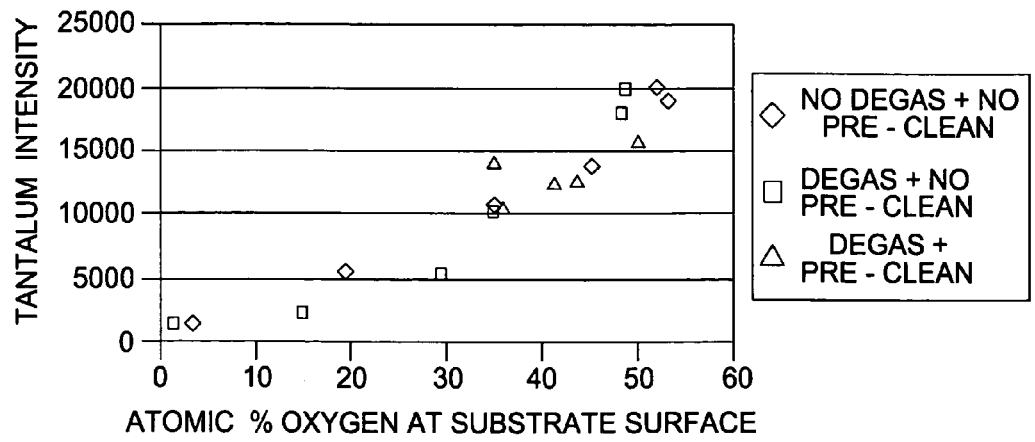
FIG. 8 is a graph showing the amount of tantalum deposited on different substrates having different atomic % oxygen in various embodiments of the invention described herein.

While the pre-cleaning of the substrate may be performed with a plasma from any of the gases described above, it was unexpectedly and surprisingly found that pre-cleaning particular dielectric layer materials with a plasma from particular gases enhanced the deposition of TaN barrier layers that were subsequently deposited on the substrate by a cyclical deposition process, such as atomic layer deposition. FIG. 5 shows that the amount of TaN deposited on a substrate, after 20 cycles of atomic layer deposition of TaN, as estimated by the amount of Ta on the substrate, was increased when substrates with exposed carbon-containing low k dielectric materials such as silicon oxycarbide, oxygen-doped silicon carbide, and carbon-based dielectric materials were pre-cleaned with argon after being degassed. FIGS. 6, 7, and 8 respectively show the atomic % carbon, atomic % silicon, and atomic % oxygen, as measured by Auger Electron Spectroscopy, at the surface of the dielectric materials of FIG. 5 versus the amount of Ta on the substrate. As used herein, "atomic %" is calculated without hydrogen. FIGS. 5, 6, 7, and 8 show that degassed and argon pre-cleaned carbon-containing dielectric layers that contain about 20 atomic % carbon to about 95% atomic carbon have improved TaN deposition compared to carbon-containing dielectric layers that contain about 20 atomic % carbon to about 95% atomic carbon but are not degassed and argon pre-cleaned. In particular, carbon-containing dielectric layers that contain about 30 atomic % carbon to about 95 atomic % carbon have improved TaN deposition, as estimated by the amount of Ta on the substrate, compared to carbon-containing dielectric layers that contain about 30 atomic % carbon to about 95% atomic carbon but are not degassed and argon pre-cleaned. A plasma from argon and an oxidizing gas, helium and an oxidizing gas, nitrogen, hydrogen, or a first plasma from an oxidizing gas followed by a second plasma from argon may be used instead of the argon plasma for pre-cleaning low k carbon-containing dielectric layers, such as carbon-containing dielectric layers that contain about 20 atomic % carbon to about 95 atomic % carbon or about 30 atomic % carbon to about 95 atomic % carbon. The oxidizing gas may be selected from the group of oxygen, ozone, nitrous oxide, nitric oxide, and $H_2O$ gas.

It is believed that pre-cleaning carbon-containing dielectric layers with a plasma from argon, argon and an oxidizing gas, helium and an oxidizing gas, nitrogen, or a first plasma from an oxidizing gas followed by a second plasma from argon may improve the nucleation rate of TaN deposition by a cyclical deposition process because pre-cleaning carbon-containing dielectric layers with any of these plasmas can create a thin, e.g., 50 Å, oxide-like surface on carbon-containing dielectric materials that typically do not have a large amount of oxygen at their surface. For example, a carbon-based dielectric layer that was 1.25 atomic % oxygen at its surface before pre-cleaning with argon was 6.88 atomic % oxygen at its surface after pre-cleaning with argon. The atomic % oxygen at the. surface of other dielectric materials before and after argon pre-cleaning is shown in FIG. 8. It is believed that the formation of Ta—O bonds on an oxide-like surface or a hydroxyl group terminated surface of a pre-cleaned substrate may enhance the nucleation rate of TaN on the substrate.

In any of the embodiments of processing sequences described below, the dielectric layer may be a carbon-containing dielectric layer, such as a carbon-containing dielectric layer that contains about 20 atomic % carbon to about 95 atomic % carbon or about 30 atomic % carbon to about 95 atomic % carbon, and the pre-cleaning may be performed with a plasma from argon, argon and an oxidizing gas, helium and an oxidizing gas, nitrogen, hydrogen, or a first plasma from an oxidizing gas followed by a second plasma from argon, as described above.

One embodiment of a processing sequence will now be described with respect to FIGS. 2 and 4. A dielectric layer 112 is deposited in step 152 on an underlying metal layer 110 of a substrate 100. The underlying metal layer 110 may be a copper layer or include copper. As discussed above, the dielectric layer 112 may be any dielectric material including a low k dielectric material ($k \leq 4.0$), whether presently known or yet to be discovered. For example, the dielectric layer 112 may be a silicon oxide or a carbon doped silicon oxide, for example. The dielectric layer 112 may be a porous low k layer, such as a porous carbon doped silicon oxide. The dielectric layer may include fluorine-doped silicon glass (FSG), Black Diamond™ film, available from Applied Materials, Inc., of Santa Clara, Calif., extremely low k (elk) dielectric film, or combinations thereof. The dielectric layer 112 may be deposited by conventional techniques in a plasma processing chamber, such as a Producer® Chamber or a DxZ® Chamber, both of which are available from Applied Materials, Inc., of Santa Clara, Calif.

Next, the dielectric layer is etched in step 154. The dielectric layer 112 may be etched using conventional photoresist patterning and etching techniques to form a feature 114 therein, such as a hole. The photoresist is then stripped from the substrate in step 156, using conventional photoresist removal techniques. After the photoresist is stripped, the substrate 100 is degassed in step 158, such as by, for example, heating the substrate at about 250° C. to about 400° C., for about 30 to about 180 seconds at a pressure between about $10^{-7}$ to about 10 torr. For example, the substrate may be heated at about 350° C. for about 100 seconds.

After the substrate 100 is degassed, the substrate is then pre-cleaned in step 160. The pre-cleaning may modify, e.g., densify, the exposed surface, including the sidewalls 116 of the feature 114, of the etched substrate dielectric layer 112. Pre-cleaning the etched dielectric layer 112 may include exposing the substrate 100 to one or more plasmas from one or more gases selected from the group of argon, helium, hydrogen, nitrogen, fluorine-containing compounds, oxidizing gases, and combinations thereof. The substrate 100 may be exposed to the plasma(s) in a pre-clean chamber, such as a Pre-Clean II Chamber, available from Applied Materials, Inc., of Santa Clara, Calif. Other types of plasma processing chambers may be used. The one or more gases are flowed into the chamber at a rate of between about 5 sccm and about 500 sccm. Typically, the plasma(s) are generated in a processing chamber by supplying RF power, such as about 300 watts (W), to a coil surrounding the processing chamber and supplying RF bias, such as about 300 W, to a substrate support member supporting the substrate. Alternatively, the plasma may be generated using a remote plasma source or both a remote plasma source and an in situ RF power source. Preferably, the substrate 100 is exposed to a plasma of argon, nitrogen, or a nitrogen and hydrogen mixture. The substrate 100 may be exposed to the plasma for between about 1 second and about 60 seconds. The length of the plasma exposure may be varied according to the plasma source gases used and the composition of the substrate.

Optionally, following the pre-cleaning, the substrate 100 may be exposed (not shown) to a hydrogen plasma or exposed to a thermal hydrogen treatment, e.g., a flow of hydrogen in the absence of radio frequency power at a temperature above about 250° C. It is believed that exposing the substrate to hydrogen may reduce any metal oxides, such as copper oxide, that may have formed on the floor 118 of the feature 114 during previous substrate processing steps.

After the substrate 100 is pre-cleaned and optionally exposed to a hydrogen plasma or a thermal hydrogen treatment, a barrier layer 130 is deposited on the substrate 100, as shown in FIG. 2B and described in step 162 of FIG. 4. The barrier layer 130 may be deposited by a cyclical deposition process, such as the cyclical deposition processes described herein. For example, a barrier layer of TaN, such as a 10 Å barrier layer, may be deposited by a cyclical deposition process. Alternatively, the barrier layer may be deposited by a chemical vapor deposition process. For example, a barrier layer of TiSiN may be deposited by chemical vapor deposition.

Figure 2C:
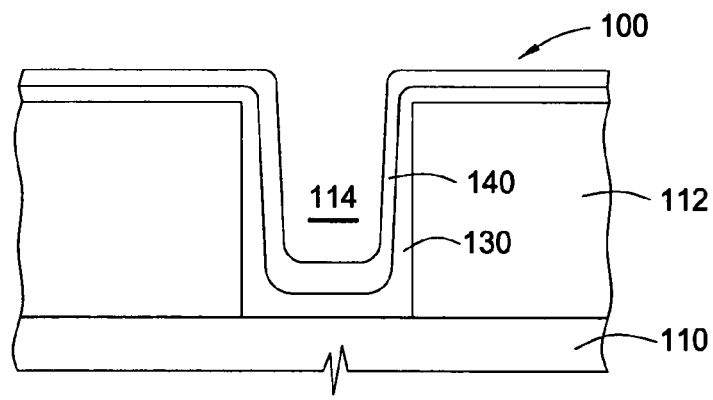

Referring to FIG. 2C and FIG. 4, the seed layer 140 may be deposited on the barrier layer 130 in step 164 using high density plasma physical vapor deposition (HDP-PVD) to enable good conformal coverage. One example of a HDP-PVD chamber is the Self-Ionized Plasma SIP™ chamber, available from Applied Materials, Inc. of Santa Clara, Calif., which may be integrated into an Endura® platform, available from Applied Materials, Inc. Of course, other techniques, such as physical vapor deposition, chemical vapor deposition, electroless plating, and electroplating, may be used.

A typical SIP™ chamber includes a target, coil, and biased substrate support member. To form the copper seed layer, a power between about 0.5 kW and about 5 kW is applied to the target, and a power between about 0.5 kW and 3 kW is applied to the coil. A power between about 200 and about 500 W at a frequency of about 13.56 MHz is applied to bias the substrate. Argon is flowed into the chamber at a rate of about 35 sccm to about 85 sccm, and nitrogen may be added to the chamber at a rate of about 5 sccm to about 100 sccm. The pressure of the chamber is typically between about 5 mTorr to about 100 mTorr.

Alternatively, a seed layer 140 consisting of copper or containing a copper alloy may be deposited in step 164 by any suitable technique such as physical vapor deposition, chemical vapor deposition, electroless deposition, or a combination of techniques. Preferably, a copper alloy seed layer 140 contains aluminum and is deposited using a PVD technique described above. During deposition, the process chamber is maintained at a pressure between about 0.1 mtorr and about 10 mtorr. The target includes copper and between about 0 and about 5 atomic weight percent of aluminum. The target may be DC-biased at a power between about 5 kW and about 100 kW. The pedestal may be RF-biased at a power between about 10 W and about 1000 W. The copper or copper alloy seed layer 140 is deposited to a thickness of at about 100 Å to about 1500 Å, such as about 500 Å, on the top surface of the substrate.

Figure 2D:
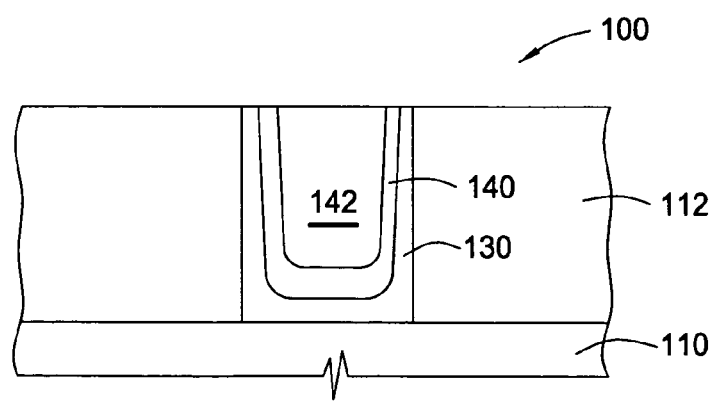

Referring to FIG. 2D, the metal layer 142 is preferably copper and deposited on seed layer 140 using CVD, PVD, electroplating, or electroless techniques. The metal layer may be deposited on the seed layer by electroplating, as described in step 166 of FIG. 4. Preferably, the copper layer 142 is formed within an electroplating cell, such as the Electra™ Cu ECP system, available from Applied Materials, Inc., of Santa Clara, Calif. The Electra™ Cu ECP system may also be integrated into an Endura® platform also available from Applied Materials, Inc.

A copper electrolyte solution and copper electroplating technique is described in commonly assigned U.S. Pat. No. 6,113,771, entitled "Electro-deposition Chemistry", which is incorporated by reference herein. The electroplating bath may contain various additives known in the art. The temperature of the bath typically is between about 15° C. and about 25° C., with a bias between about −15 volts to about 15 volts. In one aspect, the positive bias ranges from about 0.1 volts to about 10 volts and the negatives bias ranges from about −0.1 to about −10 volts.

Optionally, an anneal treatment may be performed following the metal layer 142 deposition whereby the wafer is subjected to a temperature between about 100° C. and about 400° C., such as about 350° C., for about 10 minutes to about 1 hour, preferably about 30 minutes. A carrier/purge gas such as, helium, hydrogen, nitrogen, or a mixture thereof is introduced at a rate of about 100 sccm to about 10,000 sccm. The chamber pressure is maintained between about 2 Torr and about 10 Torr. The RF power is about 200 W to about 1,000 W at a frequency of about 13.56 MHz, and the preferable substrate spacing is between about 300 mils and about 800 mils.

Following deposition, the top portion of the resulting structure may be planarized. A chemical mechanical polishing (CMP) apparatus may be used, such as the Mirra™ System available from Applied Materials, Santa Clara, Calif., for example. Optionally, the intermediate surfaces of the structure may be planarized between the deposition of the subsequent layers described above.

Figure 9A:
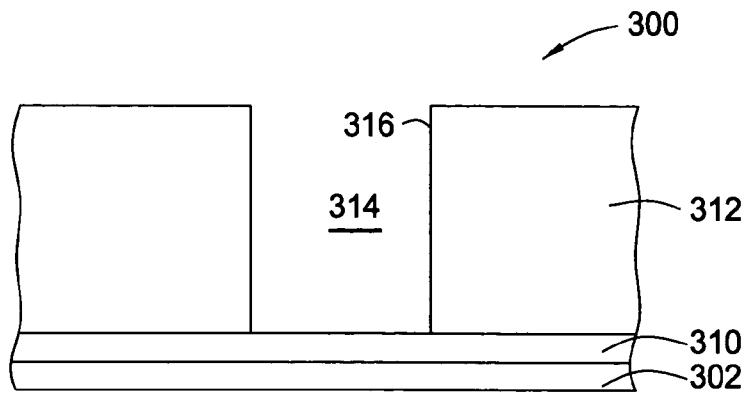
FIGS. 9A-9D are schematic cross section views of an exemplary structure at different stages of an interconnect fabrication sequence according to embodiments of the invention.

In another aspect of the invention, a substrate 300 having an etch stop 310, as shown in FIGS. 9A-9D, may be pre-cleaned as part of an integrated substrate processing sequence. A brief summary of an example of a processing sequence is shown in FIG. 10. FIG. 10 shows first that an etch stop is deposited on a substrate, as shown at step 172. Next, a dielectric layer is deposited on the etch stop, as shown at step 174. The dielectric layer is etched to the etch stop using conventional photoresist patterning and etching techniques, as shown at step 176, and then the substrate is degassed, as shown at step 178. Next, the substrate is pre-cleaned, as shown at step 180. The etch stop is then etched, as shown at step 182, and the photoresist is stripped from the substrate, as shown at step 184. A barrier layer is then deposited on the substrate, as shown at step 186, a seed layer is deposited on the substrate, as shown at step 188, and a metal layer is electroplated on the seed layer, as shown at step 190.

One embodiment of a processing sequence will now be described with respect to FIGS. 9A-D and 10. An etch stop layer 310 is deposited in step 172 on an underlying metal layer 302 of the substrate 300 before a dielectric layer 312 is deposited in step 174 on the substrate 300, as shown in FIG. 9A and described in FIG. 10. The underlying metal layer 302 may be a copper layer or include copper. The etch stop layer 310 may be a $Si_xN_y$ layer. As discussed above, the dielectric layer 312 may be any dielectric material including a low k dielectric material (k≦4.0), whether presently known or yet to be discovered. For example, the dielectric layer 312 may be a silicon oxide or a carbon doped silicon oxide. The dielectric layer 312 may be a porous low k layer, such as a porous carbon doped silicon oxide. The dielectric layer may include fluorine-doped silicon glass (FSG), Black Diamond™ film, available from Applied Materials, Inc., of Santa Clara, Calif., extremely low k (elk) dielectric film, or combinations thereof. The dielectric layer 312 may be deposited by conventional techniques in a plasma processing chamber, such as a Producer® Chamber or a DxZ® Chamber.

Next, the dielectric layer is etched to the etch stop in step 176. The dielectric layer 312 may be etched using conventional photoresist patterning and etching techniques to form a feature 314 therein, such as a hole. While the dielectric layer 312 is etched, preferably, the etch stop layer 310 is not etched. After the dielectric layer 312 is etched, the substrate 300 is degassed in step 178, such as by, for example, heating the substrate to about 350° C. for about 100 seconds.

After the substrate is degassed, the substrate is then pre-cleaned in step 180. The pre-cleaning may modify, e.g., densify, the exposed surface 316 of the etched substrate dielectric layer 312. Pre-cleaning the etched dielectric layer 312 may include exposing the substrate 300 to one or more plasmas from one or more gases selected from the group of argon, helium, hydrogen, nitrogen, fluorine-containing compounds, oxidizing gases, and combinations thereof. By pre-cleaning the substrate before the etch stop layer 310 is removed, re-sputtering of the underlying layer 302 onto the exposed surface 316 of the etched dielectric layer 312 is minimized. The substrate 300 may be exposed to the plasma in a pre-clean chamber, such as a Pre-Clean II Chamber. Alternatively, the substrate may be pre-cleaned in the same chamber in which the dielectric layer 312 is etched. Other types of plasma processing chambers may be used. Typically, the plasma is generated in a processing chamber by supplying RF power, such as about 300 watts (W), to a coil surrounding the processing chamber and supplying RF bias, such as about 300 W, to a substrate support member supporting the substrate. Preferably, the substrate is exposed to a plasma of argon. The substrate may be exposed to the plasma for between about 1 second and about 60 seconds.

After the pre-clean, the etch stop 310 is removed in step 182 from the bottom of the feature 314, such as by conventional etching techniques. Residual photoresist (not shown) remaining on the substrate is removed in step 184. The photoresist may be removed in the same chamber in which the etch stop is removed, or in a different chamber.

Optionally, following the removal of the etch stop and the photoresist, the substrate may be exposed to a hydrogen plasma or exposed to a thermal hydrogen treatment, e.g., a flow of hydrogen in the absence of radio frequency power at a temperature above about 250° C. It is believed that exposing the substrate to hydrogen may reduce any metal oxides, such as copper oxide, that may form on the underlying metal layer that is exposed after the removal of the etch stop. Optionally, the substrate is degassed and pre-cleaned again, using the same methods as described above with respect to the degas and pre-cleaning steps performed before the removal of the etch stop. The second degas and pre-clean may help remove moisture or contaminants absorbed on the substrate surface.

Figure 9B:
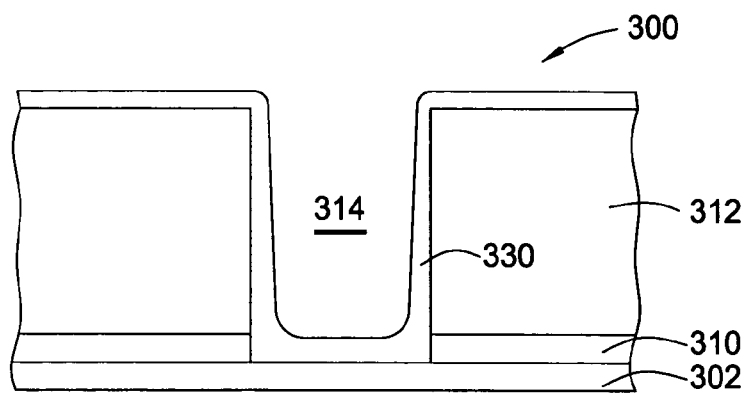
Figure 10:
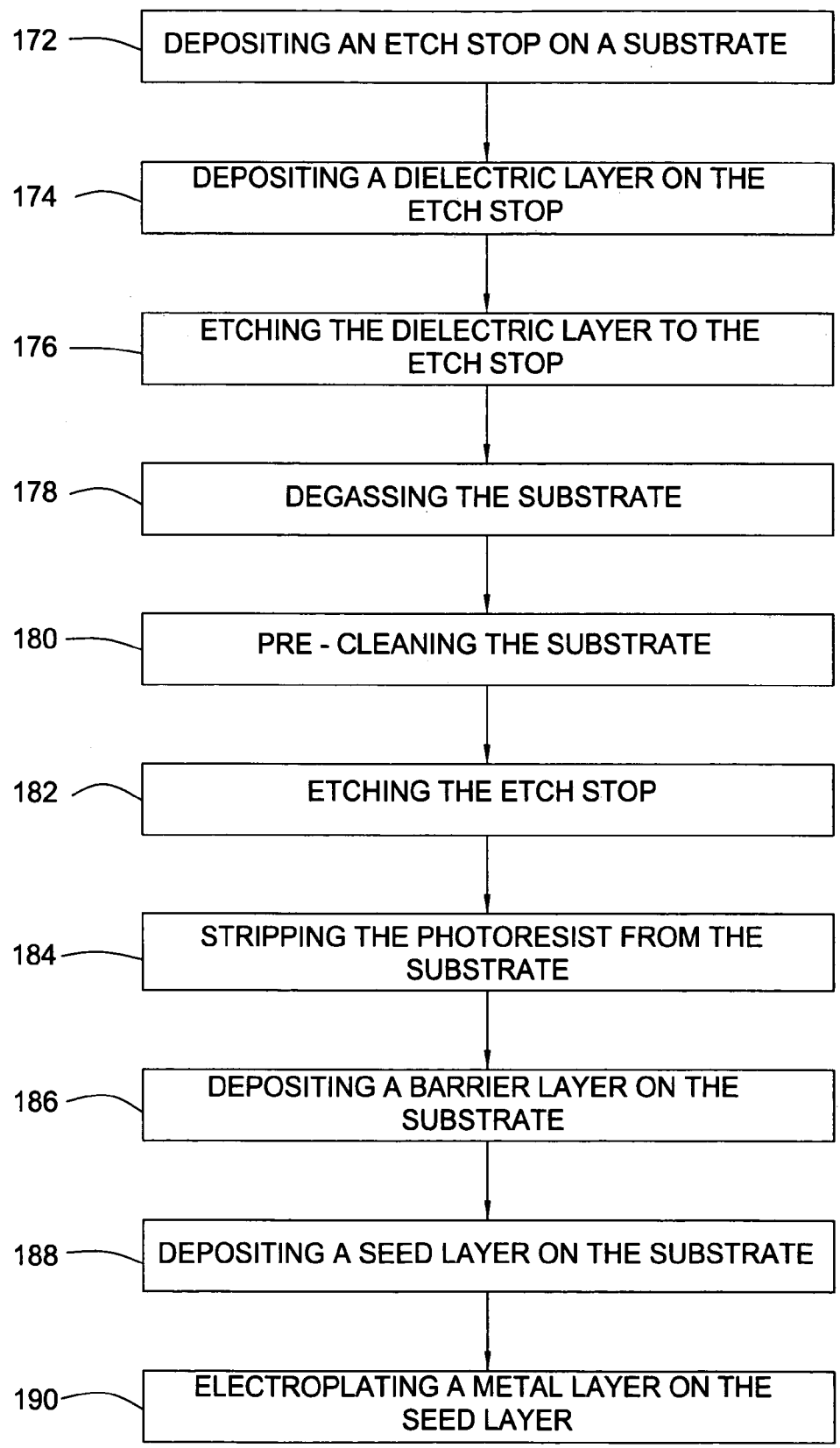
FIG. 10 illustrates a processing sequence according to various embodiments of the invention.

A barrier layer 330 is deposited in step 186 on the substrate 300, as shown in FIG. 9B. The barrier layer 330 may be deposited by a cyclical deposition process, such as any of the cyclical deposition processes described herein. For example, a barrier layer of TaN, such as a 10 Å barrier layer, may be deposited by a cyclical deposition process. Alternatively, the barrier layer may be deposited by a chemical vapor deposition process. For example, a barrier layer of TiSiN may be deposited by chemical vapor deposition.

Figure 9C:
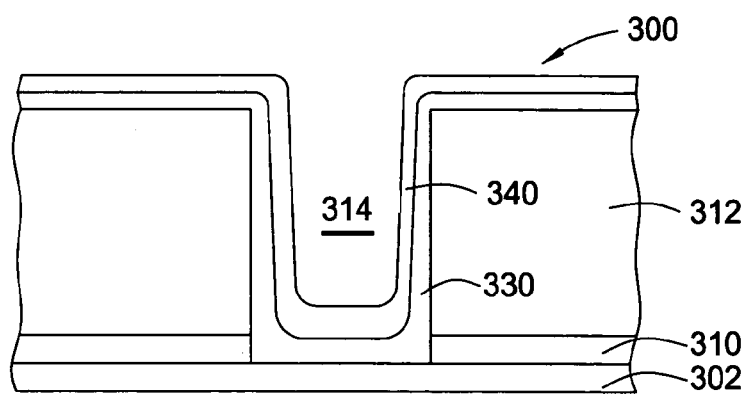

Referring to FIG. 9C, the seed layer 340 may be deposited in step 188 on the barrier layer 330 using high density plasma physical vapor deposition (HDP-PVD) to enable good conformal coverage. One example of a HDP-PVD chamber is the Self-Ionized Plasma SIP™ chamber. Of course, other techniques, such as physical vapor deposition, chemical vapor deposition, electroless plating, and electroplating, may be used.

A typical SIP™ chamber includes a target, coil, and biased substrate support member. To form the copper seed layer, a power between about 0.5 kW and about 5 kW is applied to the target, and a power between about 0.5 kW and 3 kW is applied to the coil. A power between about 200 and about 500 W at a frequency of about 13.56 MHz is applied to bias the substrate. Argon is flowed into the chamber at a rate of about 35 sccm to about 85 sccm, and nitrogen may be added to the chamber at a rate of about 5 sccm to about 100 sccm. The pressure of the chamber is typically between about 5 mTorr to about 100 mTorr.

Alternatively, a seed layer 340 consisting of copper or containing a copper alloy may be deposited by any suitable technique such as physical vapor deposition, chemical vapor deposition, electroless deposition, or a combination of techniques. Preferably, a copper alloy seed layer 340 contains aluminum and is deposited using a PVD technique described above. During deposition, the process chamber is maintained at a pressure between about 0.1 mtorr and about 10 mtorr. The target includes copper and between about 0 and about 5 atomic weight percent of aluminum. The target may be DC-biased at a power between about 5 kW and about 100 kW. The pedestal may be RF-biased at a power between about 10 W and about 1000 W. The copper or copper alloy seed layer 340 is deposited to a thickness of at about 100 Å to about 1500 Å, such as about 500 Å, on the top surface of the substrate.

Figure 9D:
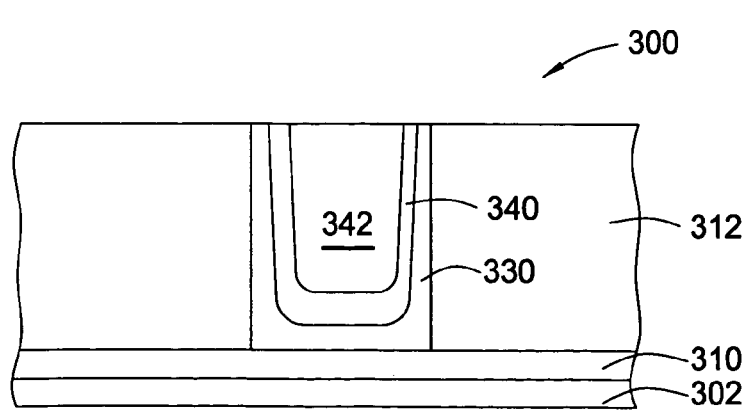

Referring to FIG. 9D, the metal layer 342 is preferably copper and deposited on seed layer 340 using CVD, PVD, electroplating, or electroless techniques. The metal layer may be deposited on the seed layer by electroplating, as described in step 190 of FIG. 10. Preferably, the copper layer 342 is formed within an electroplating cell, such as the Electra™ Cu ECP system, available from Applied Materials, Inc., of Santa Clara, Calif. The Electra™ Cu ECP system may also be integrated into an Endura® platform also available from Applied Materials, Inc.

A copper electrolyte solution and copper electroplating technique is described in commonly assigned U.S. Pat. No. 6,113,771, entitled "Electro-deposition Chemistry", which is incorporated by reference herein. The electroplating bath may contain various additives known in the art. The temperature of the bath typically is between about 15° C. and about 25° C., with a bias between about −15 volts to about 15 volts. In one aspect, the positive bias ranges from about 0.1 volts to about 10 volts and the negatives bias ranges from about −0.1 to about −10 volts.

Optionally, an anneal treatment may be performed following the metal layer 342 deposition whereby the wafer is subjected to a temperature between about 100° C. and about 400° C., such as about 350° C., for about 10 minutes to about 1 hour, preferably about 30 minutes. A carrier/purge gas such as helium, hydrogen, nitrogen, or a mixture thereof is introduced at a rate of about 100 sccm to about 10,000 sccm. The chamber pressure is maintained between about 2 Torr and about 10 Torr. The RF power is about 200 W to about 1,000 W at a frequency of about 13.56 MHz, and the preferable substrate spacing is between about 300 mils and about 800 mils.

Following deposition, the top portion of the resulting structure may be planarized. A chemical mechanical polishing (CMP) apparatus may be used, such as the Mirra™

System available from Applied Materials, Santa Clara, Calif., for example. Optionally, the intermediate surfaces of the structure may be planarized between the deposition of the subsequent layers described above.

Figure 11:
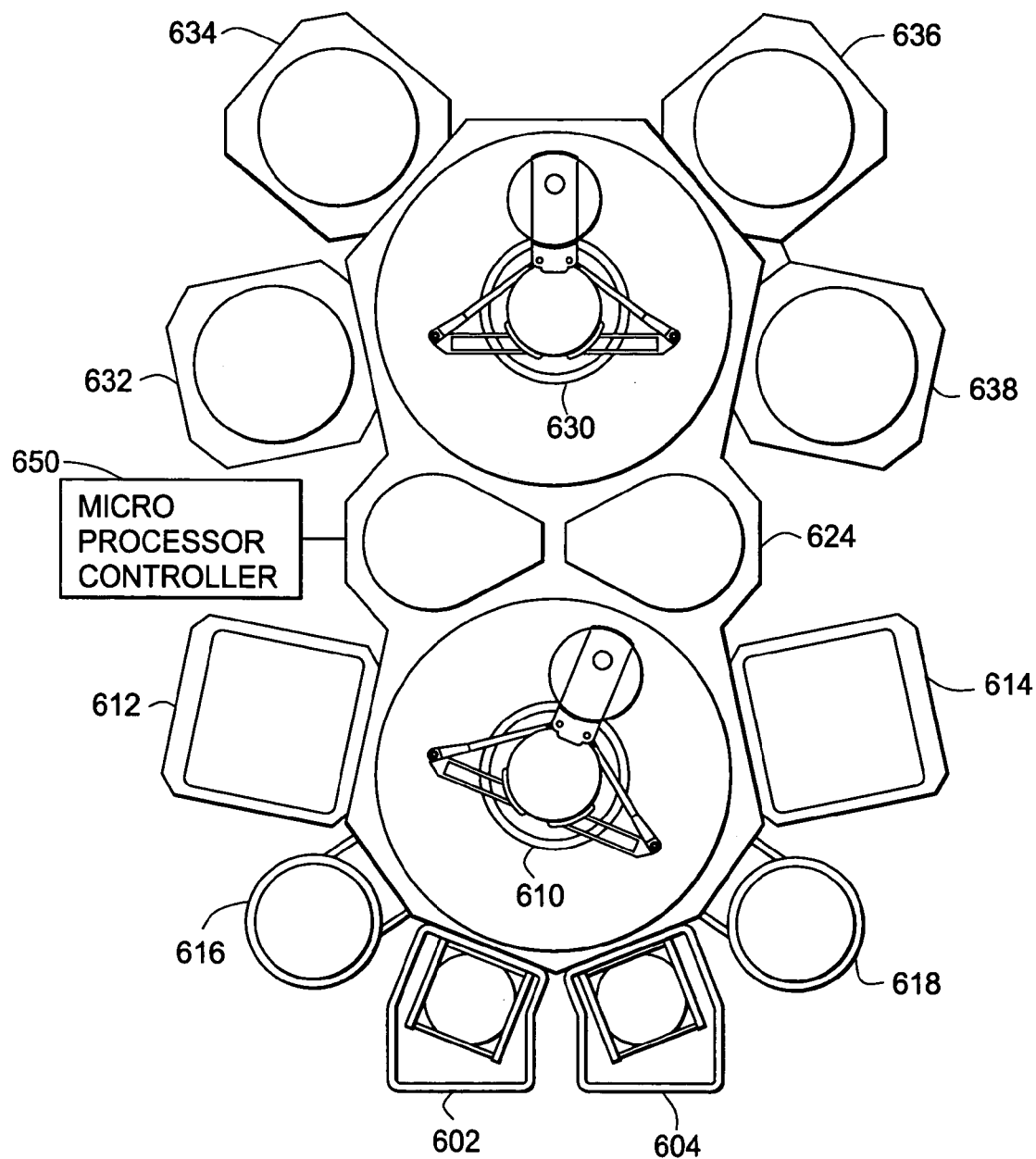
FIG. 11 illustrates a schematic plan view of an exemplary integrated cluster tool adaptable to perform embodiments of the interconnect fabrication sequence described herein.

FIG. 11 is a schematic top-view diagram of an exemplary multi-chamber processing system 600 that may be adapted to perform processes as disclosed herein. Such a processing system 600 may be an Endura® system, commercially available from Applied Materials, Inc., of Santa Clara, Calif. A similar multi-chamber processing system is disclosed in U.S. Pat. No. 5,186,718, entitled "Stage Vacuum Wafer Processing System and Method," issued on Feb. 16, 1993, which is incorporated by reference herein.

The system 600 generally includes load lock chambers 602, 604 for the transfer of substrates into and out from the system 600. Typically, since the system 600 is under vacuum, the load lock chambers 602, 604 may "pump down" the substrates introduced into the system 600. A first robot 610 may transfer the substrates between the load lock chambers 602, 604, and a first set of one or more substrate processing chambers 612, 614, 616, 618, (four are shown). Each processing chamber 612, 614, 616, 618, can be outfitted to perform a number of substrate processing operations such as cyclical layer deposition, chemical vapor deposition (CVD), physical vapor deposition (PVD), etch, pre-clean, degas, orientation and other substrate processes. The first robot 610 also transfers substrates to/from one or more transfer chambers 622, 624.

The transfer chambers 622, 624, are used to maintain ultrahigh vacuum conditions while allowing substrates to be transferred within the system 600. A second robot 630 may transfer the substrates between the transfer chambers 622, 624 and a second set of one or more processing chambers 632, 634, 636, 638. Similar to processing chambers 612, 614, 616, 618, the processing chambers 632, 634, 636, 638 can be outfitted to perform a variety of substrate processing operations, such as cyclical layer deposition, chemical vapor deposition (CVD), physical vapor deposition (PVD), etch, pre-clean, degas, and orientation, for example. Any of the substrate processing chambers 612, 614, 616, 618, 632, 634, 636, 638 may be removed from the system 600 if not necessary for a particular process to be performed by the system 600.

In one arrangement, each processing chamber 632 and 638 may be a physical vapor deposition chamber, a chemical vapor deposition chamber, or a cyclical deposition chamber adapted to deposit a seed layer; each processing chamber 634 and 636 may be a cyclical deposition chamber, a chemical vapor deposition chamber, or a physical vapor deposition chamber adapted to deposit a barrier layer; each processing chamber 612 and 614 may be a physical vapor deposition chamber, a chemical vapor deposition chamber, or a cyclical deposition chamber adapted to deposit a dielectric layer; and each processing chamber 616 and 618 may be an etch chamber outfitted to etch apertures, e.g., holes, or openings for interconnect features. The operation of the system 600 may be controlled by a microprocessor controller 650. The microprocessor controller 650 may be any device or combination of devices configured to implement the inventive operations provided herein. As such, the microprocessor controller 650 may be a controller or array of controllers and/or a general purpose computer configured with software which, when executed, performs the inventive operations. This one particular arrangement of the system 600 is provided to illustrate the invention and should not be used to limit the scope of the invention.

The following example is intended to provide a non-limiting illustration of an embodiment of the present invention.

EXAMPLE

An extremely low k (k<3) dielectric layer was deposited on a substrate. The dielectric layer was then etched to form a feature, such as a hole, therein, and an etch stop layer at the bottom of the feature is also at least partially etched. The substrate was degassed at 350° C. for about 100 seconds. The substrate was pre-cleaned in a Pre-Clean II chamber under the following conditions: 300 W of RF power was applied to the coil surrounding the chamber, a RF bias of 300 W was applied to the substrate support member supporting the substrate, and the substrate was pre-cleaned with an argon plasma for about 23 seconds. A TaN barrier layer was then deposited on the substrate from a sequential exposure of PDMAT and $NH_3$. The TaN barrier layer was deposited by first introducing argon into the chamber at 100 sccm for 0.1 seconds, and then alternately pulsing $NH_3$ at 1000 sccm for 1 second and PDMAT carried in an argon flow of 100 sccm for 0.5 seconds, with a flow of argon continuing between the pulses at 1000 sccm for 0.5 seconds. A copper seed layer was then deposited on the barrier layer. A copper fill layer was electroplated on the copper seed layer. A low temperature anneal of 250° C. was performed before performing CMP on the substrate. After CMP, the substrate was annealed at about 350° C. for about 30 minutes.

Figure 12:
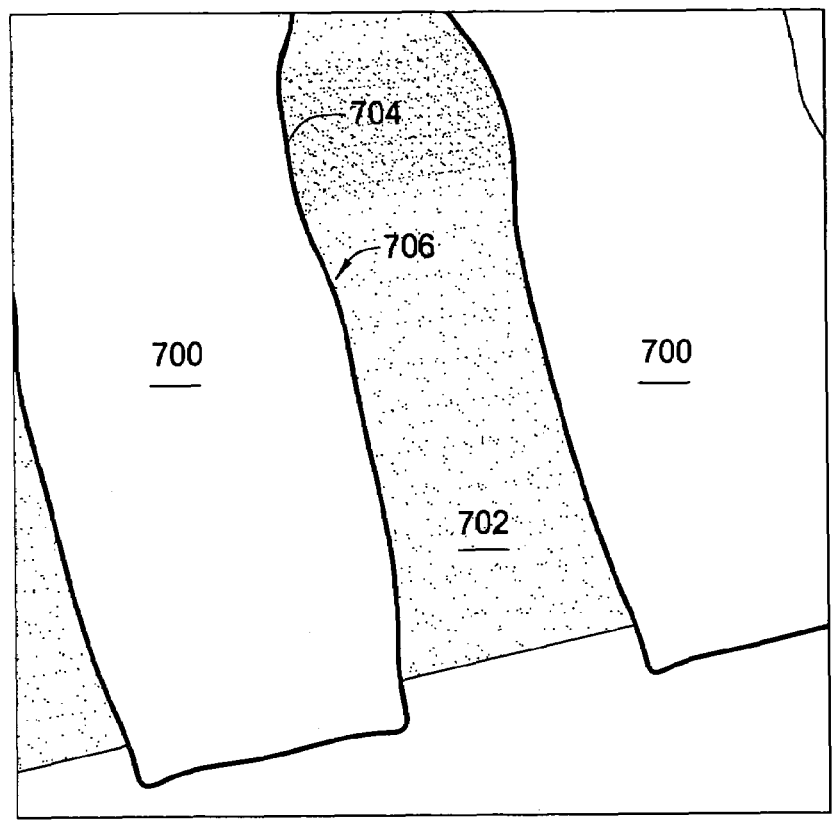
FIG. 12 is a transmission electron micrograph (TEM) of a substrate processed according to an embodiment of the invention.
Figure 13:
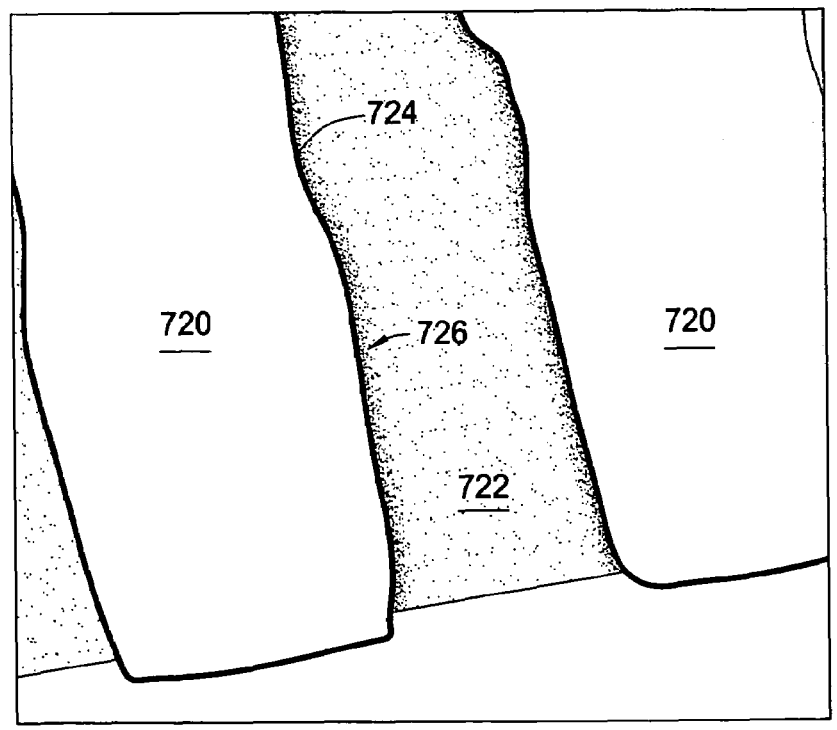
FIG. 13 is a TEM of a processed substrate according to the prior art.

FIG. 12 shows a drawing of a TEM of a substrate processed according to the Example. FIG. 13 shows a drawing of a TEM of a substrate process according to the Example, except that a pre-cleaning step was not performed. In FIG. 12, the TaN barrier layer 704 separates the copper layer 700 from the dielectric layer 702, and in FIG. 13, the TaN barrier layer 724 separates the copper layer 720 from the dielectric layer 722. In FIG. 13, the region 726 of the dielectric layer immediately adjacent the barrier layer is hazy. It is believed that the haze is created by the diffusion of the barrier layer precursors into the dielectric layer, which is porous. In FIG. 12, there is little, if any haze in the region 706 of the dielectric layer immediately adjacent the barrier layer.

It is believed that the processing sequences including a plasma pre-cleaning described herein modify the exposed surfaces of dielectric layers such that diffusion of barrier layer precursors into the dielectric layers is minimized. It is believed that the exposed surfaces of the dielectric layers are densified by the plasma pre-cleans described herein, such as by reducing the size and number of pores on the surface of the dielectric layer. It is believed that at least some of the pores on the surface of the dielectric layer are "sealed" by the rearrangement of atoms in the dielectric layer upon exposure of the dielectric layer to the plasma in the pre-cleans described herein.

While the foregoing is directed to embodiments of the present invention, other and further embodiments of the invention may be devised without departing from the basic scope thereof, and the scope thereof is determined by the claims that follow.

What is claimed is:

1. A method of processing a substrate, sequentially comprising:
   depositing a porous low k dielectric layer on the substrate;
   depositing and patterning a photoresist on the porous low k dielectric layer;

etching the porous low k dielectric layer to form a hole in the porous low k dielectric layer;
stripping the photoresist from the substrate;
degassing the substrate;
pre-cleaning the substrate, wherein pre-cleaning comprises exposing the substrate to one or more plasmas from one or more gases selected from the group of argon, helium, hydrogen, nitrogen, oxidizing gases, fluorine-containing compounds, and combinations thereof;
depositing a barrier layer directly on the porous low k dielectric layer, wherein the barrier layer is deposited by cyclical deposition;
depositing a seed layer on the barrier layer; and
electroplating a metal layer on the seed layer to fill the hole in the porous low k dielectric layer.

2. The method of claim 1, wherein the pre-cleaning densifies an exposed portion of the porous low k dielectric layer.

3. The method of claim 1, wherein the porous low k dielectric layer is a porous oxygen-doped silicon carbide.

4. The method of claim 1, wherein the pre-cleaning comprises exposing the substrate to a plasma of argon.

5. The method of claim 1, wherein the pre-cleaning is performed for between about 1 second and about 60 seconds.

6. The method of claim 1, wherein the barrier layer comprises TaN.

7. A method of processing a substrate, sequentially comprising:
depositing an etch stop on the substrate;
depositing a porous low k dielectric layer on the etch stop;
depositing and patterning a photoresist on the porous low k dielectric layer;
etching through the porous low k dielectric layer to the etch stop to form a hole in the porous low k dielectric layer;
degassing the substrate;
pre-cleaning the substrate, wherein pre-cleaning comprises exposing the substrate to one or more plasmas from one or more gases selected from the group of argon, helium, hydrogen, nitrogen, fluorine-containing compounds, oxidizing gases and combinations thereof;
etching the etch stop;
stripping the photoresist from the substrate;
depositing a barrier layer directly on the porous low k dielectric layer, wherein the barrier layer is deposited by cyclical deposition;
depositing a seed layer on the substrate; and
electroplating a metal layer on the seed layer to fill the hole in the porous low k dielectric layer.

8. The method of claim 7, wherein the porous low k dielectric layer is etched and pre-cleaned in the same chamber.

9. The method of claim 7, wherein the pre-cleaning densifies an exposed portion of the porous low k dielectric layer.

10. The method of claim 7, wherein the porous low k dielectric layer is a porous oxygen-doped silicon carbide.

11. The method of claim 7, wherein the pre-cleaning comprises exposing the substrate to a plasma of argon.

12. The method of claim 7, wherein the pre-cleaning is performed for between about 1 second and about 60 seconds.

13. The method of claim 7, wherein the plasma is generated in a processing chamber by supplying RF power to a coil surrounding the processing chamber and supplying RF bias to a substrate support member supporting the substrate.

14. The method of claim 13, wherein the RF power to the coil is about 300 W and RF bias to the substrate member is about 300 W.

15. The method of claim 7, wherein the barrier layer comprises TaN.

16. The method of claim 7, wherein the porous low k dielectric layer is a carbon-containing layer.

17. The method of claim 16, wherein the carbon-containing layer is about 20 atomic % carbon to about 95 atomic % carbon.

18. The method of claim 16, wherein the carbon-containing layer is about 30 atomic % carbon to about 95 atomic % carbon.

19. The method of claim 18, wherein the pre-cleaning comprises exposing the substrate to a plasma from argon.

20. A method of processing a substrate, sequentially comprising:
depositing a porous low k dielectric layer on the substrate;
depositing and patterning a photoresist on the porous low k dielectric layer;
stripping the photoresist from the substrate;
pre-cleaning the substrate, wherein pre-cleaning comprises exposing the substrate to an argon plasma; and
depositing a barrier layer directly on the porous low k dielectric layer by cyclical deposition.

21. The method of claim 20, wherein the pre-cleaning densifies an exposed portion of the porous low k dielectric layer.

22. The method of claim 20, wherein the barrier layer is a TaN barrier layer.

* * * * *

UNITED STATES PATENT AND TRADEMARK OFFICE
CERTIFICATE OF CORRECTION

PATENT NO. : 7,244,683 B2 Page 1 of 1
APPLICATION NO. : 10/741422
DATED : July 17, 2007
INVENTOR(S) : Chung et al.

It is certified that error appears in the above-identified patent and that said Letters Patent is hereby corrected as shown below:

Title Page item 56
Page 2, column 1, please include U.S. Patent Document US-5916365, dated 07/13/1999, patentee Lee, et al. in References Cited.

Signed and Sealed this

Eighteenth Day of December, 2007

JON W. DUDAS
*Director of the United States Patent and Trademark Office*